US012785858B2

(12) United States Patent
Sen et al.

(10) Patent No.: US 12,785,858 B2
(45) Date of Patent: Nov. 3, 2026

(54) GROUPING HARQ-ACK BITS BASED ON RETRANSMISSION NUMBER

(71) Applicant: QUALCOMM Incorporated, San Diego, CA (US)

(72) Inventors: Pinar Sen, San Diego, CA (US); Wei Yang, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 316 days.

(21) Appl. No.: 18/747,147

(22) Filed: Jun. 18, 2024

(65) Prior Publication Data

US 2025/0385758 A1 Dec. 18, 2025

(51) Int. Cl.

| | |
|---|---|
| ***H04W 4/00*** | (2018.01) |
| ***H03M 13/13*** | (2006.01) |
| ***H04L 1/1607*** | (2023.01) |
| ***H04L 1/1812*** | (2023.01) |

(52) U.S. Cl.

CPC ........ *H04L 1/1812* (2013.01); *H03M 13/136* (2013.01); *H04L 1/1642* (2013.01)

(58) Field of Classification Search

CPC ... H04L 1/1812; H04L 1/1642; H04L 1/1607; H04L 1/0013; H04L 1/1819; H04L 1/0057; H04L 1/0041; H03M 13/136; H03M 13/13; H03M 13/6306; H03M 13/6362

See application file for complete search history.

(56) References Cited

U.S. PATENT DOCUMENTS

| | | | | |
|---|---|---|---|---|
| 8,195,999 | B2 * | 6/2012 | Choi | H04L 1/1874 714/752 |
| 9,030,948 | B2 * | 5/2015 | Xu | H04L 1/1671 370/252 |
| 9,686,064 | B2 * | 6/2017 | He | H04L 5/0055 |
| 10,925,087 | B2 * | 2/2021 | Sun | H04L 5/0053 |
| 11,349,614 | B2 * | 5/2022 | Karaki | H04L 5/0055 |
| 11,483,096 | B2 * | 10/2022 | Lei | H04W 72/23 |
| 11,716,230 | B2 * | 8/2023 | Onggosanusi | H04L 1/0025 370/252 |
| 12,531,660 | B2 * | 1/2026 | Zeng | H04L 1/1812 |
| 2009/0245284 | A1 * | 10/2009 | Xu | H04L 1/0057 370/474 |
| 2010/0088570 | A1 * | 4/2010 | Choi | H04L 1/1874 714/751 |

(Continued)

*Primary Examiner* — Marceau Milord
(74) *Attorney, Agent, or Firm* — Procopio, Cory, Hargreaves & Savitch

(57) ABSTRACT

Grouping HARQ-ACK bits based on retransmission number is described. An apparatus is configured to identify sets of bits associated with HARQ feedback for a DL transmission from a network node. A first set of bits is associated with a first HARQ feedback transmission and a second set of bits is associated with a second HARQ feedback transmission for the DL transmission. The apparatus is configured to map the first set of bits as a first grouping and the second set of bits as a second grouping, which is different than the first grouping, to a coding for an UL channel. The apparatus is configured to transmit, to the network node and with the coding via the UL channel, an indication of the first set of bits and the second set of bits in accordance with the first grouping and the second grouping.

30 Claims, 13 Drawing Sheets

(56) References Cited

U.S. PATENT DOCUMENTS

| | | | | |
|---|---|---|---|---|
| 2017/0026956 | A1* | 1/2017 | Yin | H04L 1/001 |
| 2017/0171745 | A1* | 6/2017 | Asterjadhi | H04W 12/03 |
| 2018/0167369 | A1* | 6/2018 | Shapira | H04W 12/068 |
| 2019/0288790 | A1* | 9/2019 | Klenner | H04L 1/0071 |
| 2020/0404663 | A1* | 12/2020 | Zhang | H04W 76/11 |
| 2021/0176011 | A1* | 6/2021 | Lei | H04L 1/1896 |
| 2022/0038218 | A1* | 2/2022 | Kim | H04L 1/1819 |
| 2022/0109529 | A1* | 4/2022 | Ye | H04L 1/1819 |
| 2022/0286246 | A1* | 9/2022 | Bae | H04L 1/1854 |
| 2022/0352904 | A1* | 11/2022 | Montorsi | H03M 13/116 |
| 2023/0057476 | A1* | 2/2023 | Li | H04L 1/1685 |
| 2023/0075353 | A1* | 3/2023 | Zeng | H04L 1/1812 |
| 2023/0113419 | A1* | 4/2023 | Yuan | H04L 1/1614<br>370/329 |
| 2023/0291504 | A1* | 9/2023 | Cheng | H04L 1/1812 |
| 2023/0300816 | A1* | 9/2023 | Guo | H04L 1/1822<br>370/329 |
| 2024/0380520 | A1* | 11/2024 | Yuan | H04L 1/1854 |

* cited by examiner

700

702

| N | Type | K=3 | K=4 | K=5 | K=6 | K=7 | K=8 | K=9 | K=10 | K=11 | K=12 |
|---|---|---|---|---|---|---|---|---|---|---|---|
| 20 | Golay | 10 | 10 | 8 | 8 | 8 | 8 | 7 | 6 | 5 | 4 |
| | RM | 8 | 8 | 8 | 8 | 6 | 6 | 6 | 6 | 4 | |
| | PC-Polar | 11 | 9 | 8 | 8 | 6 | 6 | 6 | 6 | 4 | 4 |
| 24 | Golay | 12 | 12 | 10 | 10 | 8 | 8 | 8 | 8 | 8 | 8 |
| | RM | 10 | 9 | 9 | 9 | 7 | 7 | 6 | 6 | 4 | |
| | PC-Polar | 8 | 8 | 8 | 8 | 8 | 8 | 8 | 6 | 4 | 4 |
| 32 | Golay | 17 | 16 | 16 | 13 | 12 | 11 | 11 | 10 | 9 | 9 |
| | **RM** | **16** | **16** | **16** | **16** | **12** | **12** | **12** | **12** | **10** | |
| | PC-Polar | 18 | 16 | 8 | 16 | 12 | 12 | 12 | 12 | 8 | |

NR modified RM code 704 (N=32, K=11)

more ← location reliability 705 → less

GROUPING HARQ-ACK BITS BASED ON RETRANSMISSION NUMBER

TECHNICAL FIELD

The present disclosure relates generally to communication systems, and more particularly, to wireless communications utilizing hybrid automatic repeat request (HARQ) feedback.

INTRODUCTION

Wireless communication systems are widely deployed to provide various telecommunication services such as telephony, video, data, messaging, and broadcasts. Typical wireless communication systems may employ multiple-access technologies capable of supporting communication with multiple users by sharing available system resources. Examples of such multiple-access technologies include code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

These multiple access technologies have been adopted in various telecommunication standards to provide a common protocol that enables different wireless devices to communicate on a municipal, national, regional, and even global level. An example telecommunication standard is 5G New Radio (NR). 5G NR is part of a continuous mobile broadband evolution promulgated by Third Generation Partnership Project (3GPP) to meet new requirements associated with latency, reliability, security, scalability (e.g., with Internet of Things (IOT)), and other requirements. 5G NR includes services associated with enhanced mobile broadband (eMBB), massive machine type communications (mMTC), and ultra-reliable low latency communications (URLLC). Some aspects of 5G NR may be based on the 4G Long Term Evolution (LTE) standard. There exists a need for further improvements in 5G NR technology. These improvements may also be applicable to other multi-access technologies and the telecommunication standards that employ these technologies.

BRIEF SUMMARY

The following presents a simplified summary of one or more aspects in order to provide a basic understanding of such aspects. This summary is not an extensive overview of all contemplated aspects. This summary neither identifies key or critical elements of all aspects nor delineates the scope of any or all aspects. Its sole purpose is to present some concepts of one or more aspects in a simplified form as a prelude to the more detailed description that is presented later.

In an aspect of the disclosure, a method, a computer-readable medium, and an apparatus are provided. The apparatus may be, or may comprise, a user equipment (UE). The apparatus is configured to identify at least two sets of bits associated with hybrid automatic repeat request (HARQ) feedback for a downlink (DL) transmission from a network node, where a first set of bits of the at least two sets of bits is associated with a first HARQ feedback transmission and a second set of bits of the at least two sets of bits is associated with a second HARQ feedback transmission for the DL transmission. The apparatus is configured to map the first set of bits as a first grouping and the second set of bits as a second grouping, which is different than the first grouping, to a coding for an uplink (UL) channel. The apparatus is configured to transmit, to the network node and with the coding via the UL channel, an indication of the first set of bits and the second set of bits in accordance with the first grouping and the second grouping.

In the aspect, the method includes identifying at least two sets of bits associated with HARQ feedback for a DL transmission from a network node, where a first set of bits of the at least two sets of bits is associated with a first HARQ feedback transmission and a second set of bits of the at least two sets of bits is associated with a second HARQ feedback transmission for the DL transmission. The method includes mapping the first set of bits as a first grouping and the second set of bits as a second grouping, which is different than the first grouping, to a coding for an UL channel. The method includes transmitting, to the network node and with the coding via the UL channel, an indication of the first set of bits and the second set of bits in accordance with the first grouping and the second grouping.

In an aspect of the disclosure, a method, a computer-readable medium, and an apparatus are provided. The apparatus may be, or may comprise, a network node (e.g., a base station, gNB, a network entity, etc.). The apparatus is configured to transmit, for a UE, a DL transmission. The apparatus is also configured to receive, from the UE and via an UL channel, an indication of a first set of bits associated with a HARQ feedback transmission for the DL transmission and a second set of bits associated with a second HARQ feedback transmission for the DL transmission, where the first set of bits is in a first grouping and the second set of bits is in a second grouping, and where a mapping to a coding of the UL channel is based on the first grouping of the first set of bits and the second grouping of the second set of bits that is different than the first grouping.

In the aspect, the method includes transmitting, for a UE, a DL transmission. The method also includes receiving, from the UE and via an UL channel, an indication of a first set of bits associated with a first HARQ feedback transmission for the DL transmission and a second set of bits associated with a second HARQ feedback transmission for the DL transmission, where the first set of bits is in a first grouping and the second set of bits is in a second grouping, and where a mapping to a coding of the UL channel is based on the first grouping of the first set of bits and the second grouping of the second set of bits that is different than the first grouping.

To the accomplishment of the foregoing and related ends, the one or more aspects may include the features hereinafter fully described and particularly pointed out in the claims. The following description and the drawings set forth in detail certain illustrative features of the one or more aspects. These features are indicative, however, of but a few of the various ways in which the principles of various aspects may be employed.

DETAILED DESCRIPTION

Figure 1:
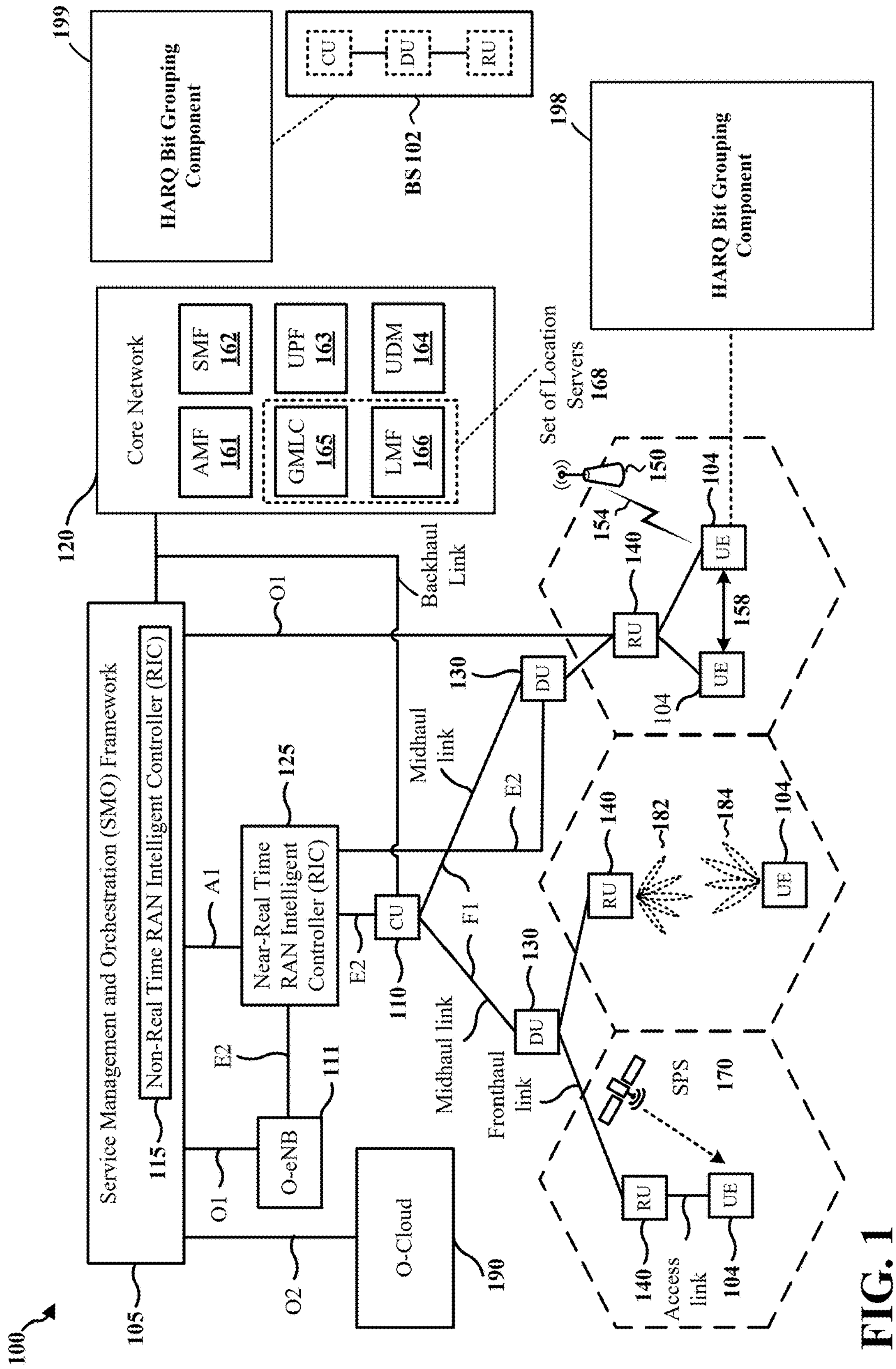
FIG. 1 is a diagram illustrating an example of a wireless communications system and an access network.

Wireless communication networks may be designed to support communications between network nodes (e.g., base stations, gNBs, etc.)/network entities (e.g., in a core network) and UEs. A UE may provide HARQ feedback for DL transmissions received from a network node to indicate an acknowledgement or a negative acknowledgement of the DL transmissions for the network node. In some cases, the UE may provide an initial transmission of HARQ feedback and one or more retransmissions of the HARQ feedback.

However, the block error rate (BLER) target for an initial transmission and a given retransmission may be very different and may correspond to different probability distributions for the respective HARQ acknowledgement (ACK) (HARQ-ACK) bits. For example, the initial transmission may have a first BLER target and a corresponding probability distribution of HARQ bits, while a retransmission may have a lower BLER target and a corresponding probability distribution of HARQ bits that is more biased towards an ACK bit than the initial transmission (e.g., a higher probability than the initial transmission). Current HARQ feedback solutions lack mechanisms that utilize grouping to (i) take advantage of channel coding gains, and (ii) achieve decoding improvements as current solutions for decoders are limited to marginal distributions of HARQ feedback bits that suffer from performance loss.

Various aspects relate generally to wireless communications utilizing HARQ feedback. Some aspects more specifically relate to grouping HARQ-ACK bits based on retransmission number. In some examples, sets of bits associated with HARQ feedback for a DL transmission from a network node may be identified, where a first set of bits is associated with a first HARQ feedback transmission and a second set of bits is associated with a second HARQ feedback transmission for the DL transmission. In some examples, the first set of bits is mapped as a first grouping and the second set of bits is mapped as a second grouping, which is different than the first grouping, to a coding of an UL channel for transmission. In some examples, a decoder may receive and decode a first set of bits for HARQ feedback in accordance with a first BLER target and decode the second set of bits in accordance with a second BLER target that is lower than the first BLER target, where the first set of bits is associated with a first probability distribution and the second set of bits is associated with a second probability distribution that is different than the first probability distribution.

Particular aspects of the subject matter described in this disclosure can be implemented to realize one or more of the following potential advantages. In some examples, by grouping HARQ feedback bits with the same distribution together during channel code mapping, the described techniques can be used to improve the coding gains. In some examples, by grouping HARQ feedback bits with the same distribution together during channel code mapping, the described techniques can be used to provide improved knowledge of prior HARQ feedback bits over marginal distributions for decoding.

The detailed description set forth below in connection with the drawings describes various configurations and does not represent the only configurations in which the concepts described herein may be practiced. The detailed description includes specific details for the purpose of providing a thorough understanding of various concepts. However, these concepts may be practiced without these specific details. In some instances, well known structures and components are shown in block diagram form in order to avoid obscuring such concepts.

Several aspects of telecommunication systems are presented with reference to various apparatus and methods. These apparatus and methods are described in the following detailed description and illustrated in the accompanying drawings by various blocks, components, circuits, processes, algorithms, etc. (collectively referred to as "elements"). These elements may be implemented using electronic hardware, computer software, or any combination thereof. Whether such elements are implemented as hardware or software depends upon the particular application and design constraints imposed on the overall system.

By way of example, an element, or any portion of an element, or any combination of elements may be implemented as a "processing system" that includes one or more processors. When multiple processors are implemented, the multiple processors may perform the functions individually or in combination. Examples of processors include microprocessors, microcontrollers, graphics processing units (GPUs), central processing units (CPUs), application processors, digital signal processors (DSPs), reduced instruction set computing (RISC) processors, systems on a chip (SoC), baseband processors, field programmable gate arrays (FPGAs), programmable logic devices (PLDs), state machines, gated logic, discrete hardware circuits, and other suitable hardware configured to perform the various functionality described throughout this disclosure. One or more processors in the processing system may execute software. Software, whether referred to as software, firmware, middleware, microcode, hardware description language, or otherwise, shall be construed broadly to mean instructions, instruction sets, code, code segments, program code, programs, subprograms, software components, applications, software applications, software packages, routines, subroutines, objects, executables, threads of execution, procedures, functions, or any combination thereof.

Accordingly, in one or more example aspects, implementations, and/or use cases, the functions described may be implemented in hardware, software, or any combination thereof. If implemented in software, the functions may be stored on or encoded as one or more instructions or code on a computer-readable medium. Computer-readable media includes computer storage media. Storage media may be any available media that can be accessed by a computer. By way of example, such computer-readable media can include a random-access memory (RAM), a read-only memory (ROM), an electrically erasable programmable ROM (EEPROM), optical disk storage, magnetic disk storage, other magnetic storage devices, combinations of the types of computer-readable media, or any other medium that can be used to store computer executable code in the form of instructions or data structures that can be accessed by a computer. While aspects, implementations, and/or use cases are described in this application by illustration to some examples, additional or different aspects, implementations and/or use cases may come about in many different arrangements and scenarios. Aspects, implementations, and/or use cases described herein may be implemented across many differing platform types, devices, systems, shapes, sizes, and packaging arrangements. For example, aspects, implementations, and/or use cases may come about via integrated chip implementations and other non-module-component based devices (e.g., end-user devices, vehicles, communication devices, computing devices, industrial equipment, retail/purchasing devices, medical devices, artificial intelligence (AI)-enabled devices, etc.). While some examples may or may not be specifically directed to use cases or applications, a wide assortment of applicability of described examples may occur. Aspects, implementations, and/or use cases may range a spectrum from chip-level or modular components to non-modular, non-chip-level implementations and further to aggregate, distributed, or original equipment manufacturer (OEM) devices or systems incorporating one or more techniques herein. In some practical settings, devices incorporating described aspects and features may also include additional components and features for implementation and practice of claimed and described aspect. For example, transmission and reception of wireless signals necessarily includes a number of components for analog and digital purposes (e.g., hardware components including antenna, RF-chains, power amplifiers, modulators, buffer, processor (s), interleaver, adders/summers, etc.). Techniques described herein may be practiced in a wide variety of devices, chip-level components, systems, distributed arrangements, aggregated or disaggregated components, end-user devices, etc. of varying sizes, shapes, and constitution.

Deployment of communication systems, such as 5G NR systems, may be arranged in multiple manners with various components or constituent parts. In a 5G NR system, or network, a network node, a network entity, a mobility element of a network, a radio access network (RAN) node, a core network node, a network element, or a network equipment, such as a base station (BS), or one or more units (or one or more components) performing base station functionality, may be implemented in an aggregated or disaggregated architecture. For example, a BS (such as a Node B (NB), evolved NB (eNB), NR BS, 5G NB, access point (AP), a transmission reception point (TRP), or a cell, etc.) may be implemented as an aggregated base station (also known as a standalone BS or a monolithic BS) or a disaggregated base station.

An aggregated base station may be configured to utilize a radio protocol stack that is physically or logically integrated within a single RAN node. A disaggregated base station may be configured to utilize a protocol stack that is physically or logically distributed among two or more units (such as one or more central or centralized units (CUs), one or more distributed units (DUs), or one or more radio units (RUs)). In some aspects, a CU may be implemented within a RAN node, and one or more DUs may be co-located with the CU, or alternatively, may be geographically or virtually distributed throughout one or multiple other RAN nodes. The DUs may be implemented to communicate with one or more RUs. Each of the CU, DU and RU can be implemented as virtual units, i.e., a virtual central unit (VCU), a virtual distributed unit (VDU), or a virtual radio unit (VRU).

Base station operation or network design may consider aggregation characteristics of base station functionality. For example, disaggregated base stations may be utilized in an integrated access backhaul (IAB) network, an open radio access network (O-RAN (such as the network configuration sponsored by the O-RAN Alliance)), or a virtualized radio access network (vRAN, also known as a cloud radio access network (C-RAN)). Disaggregation may include distributing functionality across two or more units at various physical locations, as well as distributing functionality for at least one unit virtually, which can enable flexibility in network design. The various units of the disaggregated base station, or disaggregated RAN architecture, can be configured for wired or wireless communication with at least one other unit.

FIG. 1 is a diagram 100 illustrating an example of a wireless communications system and an access network. The illustrated wireless communications system includes a disaggregated base station architecture. The disaggregated base station architecture may include one or more CUs 110 that can communicate directly with a core network 120 via a backhaul link, or indirectly with the core network 120 through one or more disaggregated base station units (such as a Near-Real Time (Near-RT) RAN Intelligent Controller (RIC) 125 via an E2 link, or a Non-Real Time (Non-RT) RIC 115 associated with a Service Management and Orchestration (SMO) Framework 105, or both). A CU 110 may communicate with one or more DUs 130 via respective midhaul links, such as an F1 interface. The DUs 130 may communicate with one or more RUs 140 via respective fronthaul links. The RUs 140 may communicate with respective UEs 104 via one or more radio frequency (RF) access links. In some implementations, the UE 104 may be simultaneously served by multiple RUs 140.

Each of the units, i.e., the CUS 110, the DUs 130, the RUs 140, as well as the Near-RT RICs 125, the Non-RT RICs 115, and the SMO Framework 105, may include one or more interfaces or be coupled to one or more interfaces configured to receive or to transmit signals, data, or information (collectively, signals) via a wired or wireless transmission medium. Each of the units, or an associated processor or controller providing instructions to the communication interfaces of the units, can be configured to communicate with one or more of the other units via the transmission medium. For example, the units can include a wired interface configured to receive or to transmit signals over a wired transmission medium to one or more of the other units. Additionally, the units can include a wireless interface, which may include a receiver, a transmitter, or a transceiver (such as an RF transceiver), configured to receive or to transmit signals, or both, over a wireless transmission medium to one or more of the other units.

In some aspects, the CU 110 may host one or more higher layer control functions. Such control functions can include radio resource control (RRC), packet data convergence protocol (PDCP), service data adaptation protocol (SDAP), or the like. Each control function can be implemented with an interface configured to communicate signals with other control functions hosted by the CU 110. The CU 110 may be configured to handle user plane functionality (i.e., Central Unit-User Plane (CU-UP)), control plane functionality (i.e., Central Unit-Control Plane (CU-CP)), or a combination thereof. In some implementations, the CU 110 can be logically split into one or more CU-UP units and one or more CU-CP units. The CU-UP unit can communicate bidirectionally with the CU-CP unit via an interface, such as an E1 interface when implemented in an O-RAN configuration. The CU 110 can be implemented to communicate with the DU 130, as necessary, for network control and signaling.

The DU 130 may correspond to a logical unit that includes one or more base station functions to control the operation of one or more RUs 140. In some aspects, the DU 130 may host one or more of a radio link control (RLC) layer, a medium access control (MAC) layer, and one or more high physical (PHY) layers (such as modules for forward error correction (FEC) encoding and decoding, scrambling, modulation, demodulation, or the like) depending, at least in part, on a functional split, such as those defined by 3GPP. In some aspects, the DU 130 may further host one or more low PHY layers. Each layer (or module) can be implemented with an interface configured to communicate signals with other layers (and modules) hosted by the DU 130, or with the control functions hosted by the CU 110.

Lower-layer functionality can be implemented by one or more RUs 140. In some deployments, an RU 140, controlled by a DU 130, may correspond to a logical node that hosts RF processing functions, or low-PHY layer functions (such as performing fast Fourier transform (FFT), inverse FFT (iFFT), digital beamforming, physical random access channel (PRACH) extraction and filtering, or the like), or both, based at least in part on the functional split, such as a lower layer functional split. In such an architecture, the RU(s) 140 can be implemented to handle over the air (OTA) communication with one or more UEs 104. In some implementations, real-time and non-real-time aspects of control and user plane communication with the RU(s) 140 can be controlled by the corresponding DU 130. In some scenarios, this configuration can enable the DU(s) 130 and the CU 110 to be implemented in a cloud-based RAN architecture, such as a vRAN architecture.

The SMO Framework 105 may be configured to support RAN deployment and provisioning of non-virtualized and virtualized network elements. For non-virtualized network elements, the SMO Framework 105 may be configured to support the deployment of dedicated physical resources for RAN coverage requirements that may be managed via an operations and maintenance interface (such as an O1 interface). For virtualized network elements, the SMO Framework 105 may be configured to interact with a cloud computing platform (such as an open cloud (O-Cloud) 190) to perform network element life cycle management (such as to instantiate virtualized network elements) via a cloud computing platform interface (such as an O2 interface). Such virtualized network elements can include, but are not limited to, CUs 110, DUs 130, RUs 140 and Near-RT RICs 125. In some implementations, the SMO Framework 105 can communicate with a hardware aspect of a 4G RAN, such as an open eNB (O-eNB) 111, via an O1 interface. Additionally, in some implementations, the SMO Framework 105 can communicate directly with one or more RUs 140 via an O1 interface. The SMO Framework 105 also may include a Non-RT RIC 115 configured to support functionality of the SMO Framework 105.

The Non-RT RIC 115 may be configured to include a logical function that enables non-real-time control and optimization of RAN elements and resources, artificial intelligence (AI)/machine learning (ML) (AI/ML) workflows including model training and updates, or policy-based guidance of applications/features in the Near-RT RIC 125. The Non-RT RIC 115 may be coupled to or communicate with (such as via an A1 interface) the Near-RT RIC 125. The Near-RT RIC 125 may be configured to include a logical function that enables near-real-time control and optimization of RAN elements and resources via data collection and actions over an interface (such as via an E2 interface) connecting one or more CUs 110, one or more DUs 130, or both, as well as an O-eNB, with the Near-RT RIC 125.

In some implementations, to generate AI/ML models to be deployed in the Near-RT RIC 125, the Non-RT RIC 115 may receive parameters or external enrichment information from external servers. Such information may be utilized by the Near-RT RIC 125 and may be received at the SMO Framework 105 or the Non-RT RIC 115 from non-network data sources or from network functions. In some examples, the Non-RT RIC 115 or the Near-RT RIC 125 may be configured to tune RAN behavior or performance. For example, the Non-RT RIC 115 may monitor long-term trends and patterns for performance and employ AI/ML models to perform corrective actions through the SMO Framework 105 (such as reconfiguration via O1) or via creation of RAN management policies (such as A1 policies).

At least one of the CU 110, the DU 130, and the RU 140 may be referred to as a base station 102. Accordingly, a base station 102 may include one or more of the CU 110, the DU 130, and the RU 140 (each component indicated with dotted lines to signify that each component may or may not be included in the base station 102). The base station 102 provides an access point to the core network 120 for a UE 104. The base station 102 may include macrocells (high power cellular base station) and/or small cells (low power cellular base station). The small cells include femtocells, picocells, and microcells. A network that includes both small cell and macrocells may be known as a heterogeneous network. A heterogeneous network may also include Home Evolved Node Bs (eNBs) (HeNBs), which may provide service to a restricted group known as a closed subscriber group (CSG). The communication links between the RUs 140 and the UEs 104 may include uplink (UL) (also referred to as reverse link) transmissions from a UE 104 to an RU 140 and/or downlink (DL) (also referred to as forward link) transmissions from an RU 140 to a UE 104. The communication links may use multiple-input and multiple-output (MIMO) antenna technology, including spatial multiplexing, beamforming, and/or transmit diversity. The communication links may be through one or more carriers. The base station 102/UEs 104 may use spectrum up to Y MHz (e.g., 5, 10, 15, 20, 100, 400, etc. MHz) bandwidth per carrier allocated in a carrier aggregation of up to a total of Yx MHz (x component carriers) used for transmission in each direction. The carriers may or may not be adjacent to each other. Allocation of carriers may be asymmetric with respect to DL and UL (e.g., more or fewer carriers may be allocated for DL than for UL). The component carriers may include a primary component carrier and one or more secondary component carriers. A primary component carrier may be referred to as a primary cell (PCell) and a secondary component carrier may be referred to as a secondary cell (SCell).

Certain UEs 104 may communicate with each other using device-to-device (D2D) communication link 158. The D2D communication link 158 may use the DL/UL wireless wide area network (WWAN) spectrum. The D2D communication link 158 may use one or more sidelink channels, such as a physical sidelink broadcast channel (PSBCH), a physical sidelink discovery channel (PSDCH), a physical sidelink shared channel (PSSCH), and a physical sidelink control channel (PSCCH). D2D communication may be through a variety of wireless D2D communications systems, such as for example, Bluetooth™ (Bluetooth is a trademark of the Bluetooth Special Interest Group (SIG)), Wi-Fi™ (Wi-Fi is a trademark of the Wi-Fi Alliance) based on the Institute of Electrical and Electronics Engineers (IEEE) 802.11 standard, LTE, or NR.

The wireless communications system may further include a Wi-Fi AP 150 in communication with UEs 104 (also referred to as Wi-Fi stations (STAs)) via communication link 154, e.g., in a 5 GHz unlicensed frequency spectrum or the like. When communicating in an unlicensed frequency spectrum, the UEs 104/AP 150 may perform a clear channel assessment (CCA) prior to communicating in order to determine whether the channel is available.

The electromagnetic spectrum is often subdivided, based on frequency/wavelength, into various classes, bands, channels, etc. In 5G NR, two initial operating bands have been identified as frequency range designations FR1 (410 MHz-7.125 GHz) and FR2 (24.25 GHz-52.6 GHz). Although a portion of FR1 is greater than 6 GHz, FR1 is often referred to (interchangeably) as a "sub-6 GHz" band in various documents and articles. A similar nomenclature issue sometimes occurs with regard to FR2, which is often referred to (interchangeably) as a "millimeter wave" band in documents and articles, despite being different from the extremely high frequency (EHF) band (30 GHz-300 GHz) which is identified by the International Telecommunications Union (ITU) as a "millimeter wave" band.

The frequencies between FR1 and FR2 are often referred to as mid-band frequencies. Recent 5G NR studies have identified an operating band for these mid-band frequencies as frequency range designation FR3 (7.125 GHz-24.25 GHz). Frequency bands falling within FR3 may inherit FR1 characteristics and/or FR2 characteristics, and thus may effectively extend features of FR1 and/or FR2 into mid-band frequencies. In addition, higher frequency bands are currently being explored to extend 5G NR operation beyond 52.6 GHz. For example, three higher operating bands have been identified as frequency range designations FR2-2 (52.6 GHz-71 GHz), FR4 (71 GHz-114.25 GHz), and FR5 (114.25 GHZ-300 GHz). Each of these higher frequency bands falls within the EHF band.

With the above aspects in mind, unless specifically stated otherwise, the term "sub-6 GHz" or the like if used herein may broadly represent frequencies that may be less than 6 GHz, may be within FR1, or may include mid-band frequencies. Further, unless specifically stated otherwise, the term "millimeter wave" or the like if used herein may broadly represent frequencies that may include mid-band frequencies, may be within FR2, FR4, FR2-2, and/or FR5, or may be within the EHF band.

The base station 102 and the UE 104 may each include a plurality of antennas, such as antenna elements, antenna panels, and/or antenna arrays to facilitate beamforming. The base station 102 may transmit a beamformed signal 182 to the UE 104 in one or more transmit directions. The UE 104 may receive the beamformed signal from the base station 102 in one or more receive directions. The UE 104 may also transmit a beamformed signal 184 to the base station 102 in one or more transmit directions. The base station 102 may receive the beamformed signal from the UE 104 in one or more receive directions. The base station 102/UE 104 may perform beam training to determine the best receive and transmit directions for each of the base station 102/UE 104. The transmit and receive directions for the base station 102 may or may not be the same. The transmit and receive directions for the UE 104 may or may not be the same.

The base station 102 may include and/or be referred to as a gNB, Node B, eNB, an access point, a base transceiver station, a radio base station, a radio transceiver, a transceiver function, a basic service set (BSS), an extended service set (ESS), a TRP, network node, network entity, network equipment, or some other suitable terminology. The base station 102 can be implemented as an integrated access and backhaul (IAB) node, a relay node, a sidelink node, an aggregated (monolithic) base station with a baseband unit (BBU) (including a CU and a DU) and an RU, or as a disaggregated base station including one or more of a CU, a DU, and/or an RU. The set of base stations, which may include disaggregated base stations and/or aggregated base stations, may be referred to as next generation (NG) RAN (NG-RAN).

The core network 120 may include an Access and Mobility Management Function (AMF) 161, a Session Management Function (SMF) 162, a User Plane Function (UPF) 163, a Unified Data Management (UDM) 164, one or more location servers 168, and other functional entities. The AMF 161 is the control node that processes the signaling between the UEs 104 and the core network 120. The AMF 161 supports registration management, connection management, mobility management, and other functions. The SMF 162 supports session management and other functions. The UPF 163 supports packet routing, packet forwarding, and other functions. The UDM 164 supports the generation of authentication and key agreement (AKA) credentials, user identification handling, access authorization, and subscription management. The one or more location servers 168 are illustrated as including a Gateway Mobile Location Center (GMLC) 165 and a Location Management Function (LMF) 166. However, generally, the one or more location servers 168 may include one or more location/positioning servers, which may include one or more of the GMLC 165, the LMF 166, a position determination entity (PDE), a serving mobile location center (SMLC), a mobile positioning center (MPC), or the like. The GMLC 165 and the LMF 166 support UE location services. The GMLC 165 provides an interface for clients/applications (e.g., emergency services) for accessing UE positioning information. The LMF 166 receives measurements and assistance information from the NG-RAN and the UE 104 via the AMF 161 to compute the position of the UE 104. The NG-RAN may utilize one or more positioning methods in order to determine the position of the UE 104. Positioning the UE 104 may involve signal measurements, a position estimate, and an optional velocity computation based on the measurements. The signal measurements may be made by the UE 104 and/or the base station 102 serving the UE 104. The signals measured may be based on one or more of a satellite positioning system (SPS) 170 (e.g., one or more of a Global Navigation Satellite System (GNSS), global position system (GPS), non-terrestrial network (NTN), or other satellite position/location system), LTE signals, wireless local area network (WLAN) signals, Bluetooth signals, a terrestrial beacon system (TBS), sensor-based information (e.g., barometric pressure sensor, motion sensor), NR enhanced cell ID (NR E-CID) methods, NR signals (e.g., multi-round trip time (Multi-RTT), DL angle-of-departure (DL-AoD), DL time difference of arrival (DL-TDOA), UL time difference of arrival (UL-TDOA), and UL angle-of-arrival (UL-AoA) positioning), and/or other systems/signals/sensors.

Examples of UEs 104 include a cellular phone, a smart phone, a session initiation protocol (SIP) phone, a laptop, a personal digital assistant (PDA), a satellite radio, a global positioning system, a multimedia device, a video device, a digital audio player (e.g., MP3 player), a camera, a game console, a tablet, a smart device, a wearable device, a vehicle, an electric meter, a gas pump, a large or small kitchen appliance, a healthcare device, an implant, a sensor/actuator, a display, or any other similar functioning device. Some of the UEs 104 may be referred to as IoT devices (e.g., parking meter, gas pump, toaster, vehicles, heart monitor, etc.). The UE 104 may also be referred to as a station, a mobile station, a subscriber station, a mobile unit, a subscriber unit, a wireless unit, a remote unit, a mobile device, a wireless device, a wireless communications device, a remote device, a mobile subscriber station, an access terminal, a mobile terminal, a wireless terminal, a remote terminal, a handset, a user agent, a mobile client, a client, or some other suitable terminology. In some scenarios, the term UE may also apply to one or more companion devices such as in a device constellation arrangement. One or more of these devices may collectively access the network and/or individually access the network.

Referring again to FIG. 1, in certain aspects, the UE 104 may have a HARQ bit grouping component 198 ("component 198") that may be configured to identify at least two sets of bits associated with HARQ feedback for a DL transmission from a network node, where a first set of bits of the at least two sets of bits is associated with a first HARQ feedback transmission and a second set of bits of the at least two sets of bits is associated with a second HARQ feedback transmission for the DL transmission. The component 198 may be configured to map the first set of bits as a first grouping and the second set of bits as a second grouping, which is different than the first grouping, to a coding for an UL channel. The component 198 may be configured to transmit, to the network node and with the coding via the UL channel, an indication of the first set of bits and the second set of bits in accordance with the first grouping and the second grouping. In certain aspects, the base station 102 may have a HARQ bit grouping component 199 ("component 199") that may be configured to transmit, for a UE, a DL transmission. The component 199 may be configured to receive, from the UE and via an UL channel, an indication of a first set of bits associated with a HARQ feedback transmission for the DL transmission and a second set of bits associated with a second HARQ feedback transmission for the DL transmission, where the first set of bits is in a first grouping and the second set of bits is in a second grouping, and where a mapping to a coding of the UL channel is based on the first grouping of the first set of bits and the second grouping of the second set of bits that is different than the first grouping. The component 199 may be configured to decode the first set of bits in accordance with a first BLER target and the second set of bits in accordance with a second BLER target that is lower than the first BLER target, where the first set of bits is associated with a first probability distribution and the second set of bits is associated with a second probability distribution that is different than the first probability distribution. Accordingly, aspects herein for grouping HARQ-ACK bits based on retransmission number improve coding gains and provide improved knowledge of prior HARQ feedback bits over marginal distributions for decoding by grouping HARQ feedback bits with the same distribution together during channel code mapping.

Figure 2B:
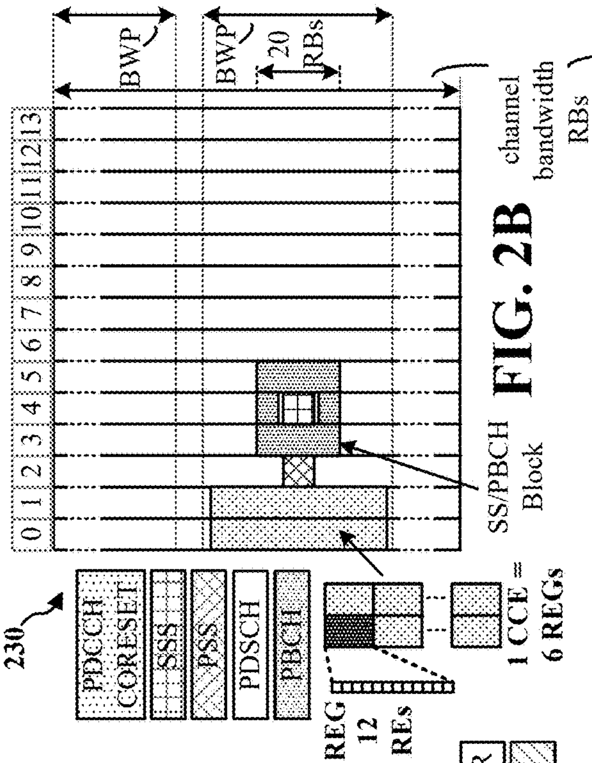
FIG. 2B is a diagram illustrating an example of downlink (DL) channels within a subframe, in accordance with various aspects of the present disclosure.
Figure 2D:
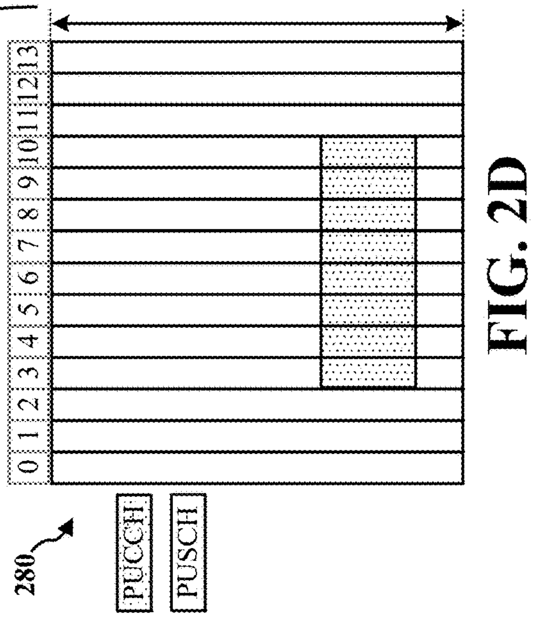
FIG. 2D is a diagram illustrating an example of uplink (UL) channels within a subframe, in accordance with various aspects of the present disclosure.
Figure 2A:
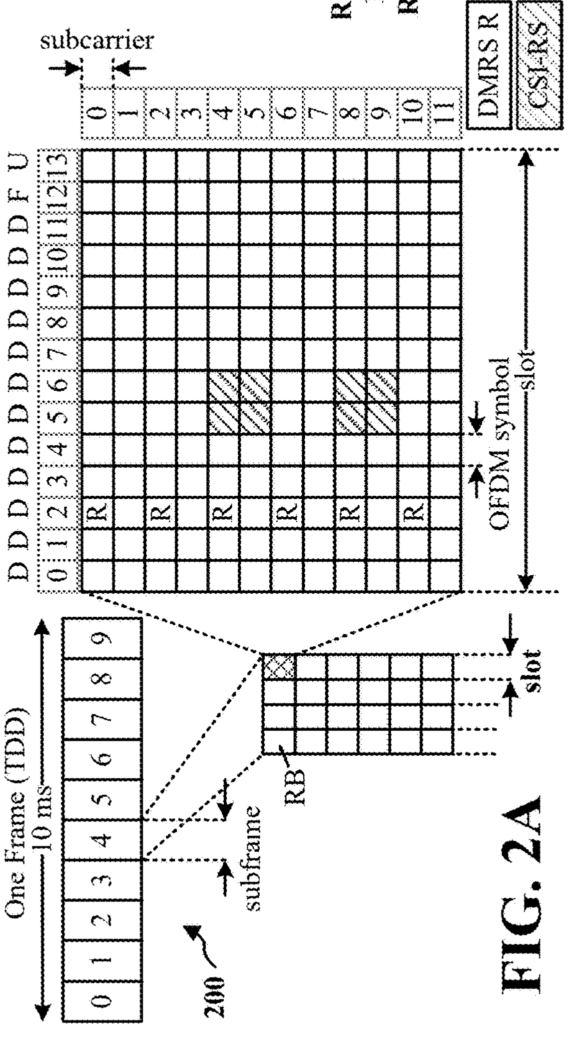
FIG. 2A is a diagram illustrating an example of a first frame, in accordance with various aspects of the present disclosure.
Figure 2C:
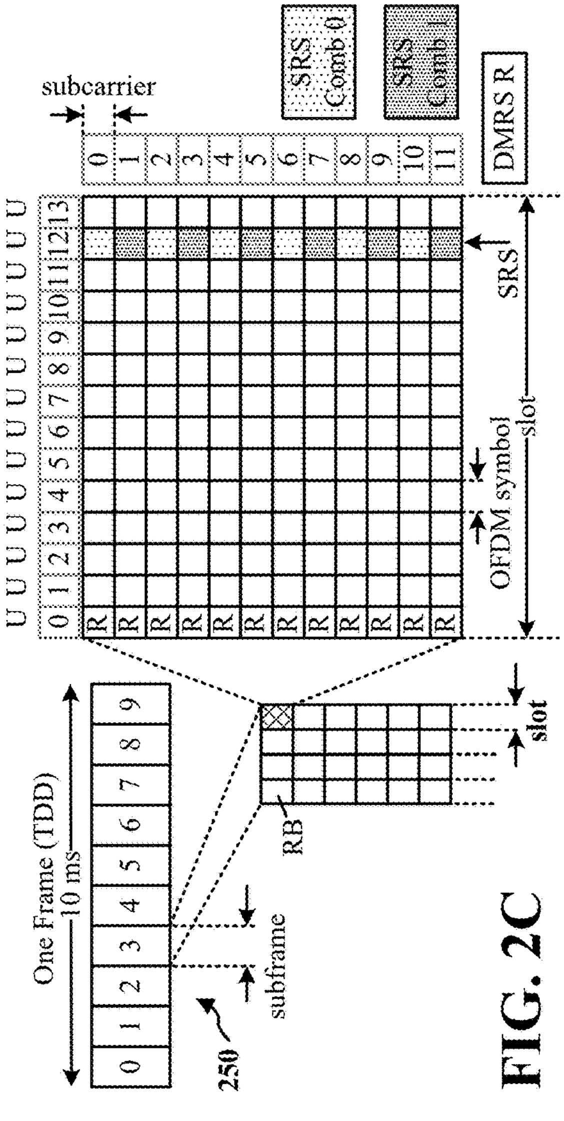
FIG. 2C is a diagram illustrating an example of a second frame, in accordance with various aspects of the present disclosure.

FIG. 2A is a diagram 200 illustrating an example of a first subframe within a 5G NR frame structure. FIG. 2B is a diagram 230 illustrating an example of DL channels within a 5G NR subframe. FIG. 2C is a diagram 250 illustrating an example of a second subframe within a 5G NR frame structure. FIG. 2D is a diagram 280 illustrating an example of UL channels within a 5G NR subframe. The 5G NR frame structure may be frequency division duplexed (FDD) in which for a particular set of subcarriers (carrier system bandwidth), subframes within the set of subcarriers are dedicated for either DL or UL, or may be time division duplexed (TDD) in which for a particular set of subcarriers (carrier system bandwidth), subframes within the set of subcarriers are dedicated for both DL and UL. In the examples provided by FIGS. 2A, 2C, the 5G NR frame structure is assumed to be TDD, with subframe 4 being configured with slot format 28 (with mostly DL), where D is DL, U is UL, and F is flexible for use between DL/UL, and subframe 3 being configured with slot format 1 (with all UL). While subframes 3, 4 are shown with slot formats 1, 28, respectively, any particular subframe may be configured with any of the various available slot formats 0-61. Slot formats 0, 1 are all DL, UL, respectively. Other slot formats 2-61 include a mix of DL, UL, and flexible symbols. UEs are configured with the slot format (dynamically through DL control information (DCI), or semi-statically/statically through radio resource control (RRC) signaling) through a received slot format indicator (SFI). Note that the description infra applies also to a 5G NR frame structure that is TDD.

FIGS. 2A-2D illustrate a frame structure, and the aspects of the present disclosure may be applicable to other wireless communication technologies, which may have a different frame structure and/or different channels. A frame (10 ms) may be divided into 10 equally sized subframes (1 ms). Each subframe may include one or more time slots. Subframes may also include mini-slots, which may include 7, 4, or 2 symbols. Each slot may include 14 or 12 symbols, depending on whether the cyclic prefix (CP) is normal or extended. For normal CP, each slot may include 14 symbols, and for extended CP, each slot may include 12 symbols. The symbols on DL may be CP orthogonal frequency division multiplexing (OFDM) (CP-OFDM) symbols. The symbols on UL may be CP-OFDM symbols (for high throughput scenarios) or discrete Fourier transform (DFT) spread OFDM (DFT-s-OFDM) symbols (for power limited scenarios; limited to a single stream transmission). The number of slots within a subframe is based on the CP and the numerology. The numerology defines the subcarrier spacing (SCS) (see Table 1). The symbol length/duration may scale with 1/SCS.

TABLE 1

Numerology, SCS, and CP

| $\mu$ | SCS $\Delta f = 2^{\mu} \cdot 15$[kHz] | Cyclic prefix |
|---|---|---|
| 0 | 15 | Normal |
| 1 | 30 | Normal |
| 2 | 60 | Normal, Extended |
| 3 | 120 | Normal |

TABLE 1-continued

| Numerology, SCS, and CP | | |
|---|---|---|
| μ | SCS $\Delta f = 2^{\mu} \cdot 15$[kHz] | Cyclic prefix |
| 4 | 240 | Normal |
| 5 | 480 | Normal |
| 6 | 960 | Normal |

For normal CP (14 symbols/slot), different numerologies μ 0 to 4 allow for 1, 2, 4, 8, and 16 slots, respectively, per subframe. For extended CP, the numerology 2 allows for 4 slots per subframe. Accordingly, for normal CP and numerology μ, there are 14 symbols/slot and $2^{\mu}$ slots/subframe. The subcarrier spacing may be equal to $2^{\mu}*15$ kHz, where μ is the numerology 0 to 4. As such, the numerology μ=0 has a subcarrier spacing of 15 kHz and the numerology μ=4 has a subcarrier spacing of 240 kHz. The symbol length/duration is inversely related to the subcarrier spacing. FIGS. 2A-2D provide an example of normal CP with 14 symbols per slot and numerology μ=2 with 4 slots per subframe. The slot duration is 0.25 ms, the subcarrier spacing is 60 kHz, and the symbol duration is approximately 16.67 μs. Within a set of frames, there may be one or more different bandwidth parts (BWPs) (see FIG. 2B) that are frequency division multiplexed. Each BWP may have a particular numerology and CP (normal or extended).

A resource grid may be used to represent the frame structure. Each time slot includes a resource block (RB) (also referred to as physical RBs (PRBs)) that extends 12 consecutive subcarriers. The resource grid is divided into multiple resource elements (REs). The number of bits carried by each RE depends on the modulation scheme. As illustrated in FIG. 2A, some of the REs carry reference (pilot) signals (RS) for the UE. The RS may include demodulation RS (DM-RS) (indicated as R for one particular configuration, but other DM-RS configurations are possible) and channel state information reference signals (CSI-RS) for channel estimation at the UE. The RS may also include beam measurement RS (BRS), beam refinement RS (BRRS), and phase tracking RS (PT-RS).

FIG. 2B illustrates an example of various DL channels within a subframe of a frame. The physical downlink control channel (PDCCH) carries DCI within one or more control channel elements (CCEs) (e.g., 1, 2, 4, 8, or 16 CCEs), each CCE including six RE groups (REGs), each REG including 12 consecutive REs in an OFDM symbol of an RB. A PDCCH within one BWP may be referred to as a control resource set (CORESET). A UE is configured to monitor PDCCH candidates in a PDCCH search space (e.g., common search space, UE-specific search space) during PDCCH monitoring occasions on the CORESET, where the PDCCH candidates have different DCI formats and different aggregation levels. Additional BWPs may be located at greater and/or lower frequencies across the channel bandwidth. A primary synchronization signal (PSS) may be within symbol 2 of particular subframes of a frame. The PSS is used by a UE 104 to determine subframe/symbol timing and a physical layer identity. A secondary synchronization signal (SSS) may be within symbol 4 of particular subframes of a frame. The SSS is used by a UE to determine a physical layer cell identity group number and radio frame timing. Based on the physical layer identity and the physical layer cell identity group number, the UE can determine a physical cell identifier (PCI). Based on the PCI, the UE can determine the locations of the DM-RS. The physical broadcast channel (PBCH), which carries a master information block (MIB), may be logically grouped with the PSS and SSS to form a synchronization signal (SS)/PBCH block (also referred to as SS block (SSB)). The MIB provides a number of RBs in the system bandwidth and a system frame number (SFN). The physical downlink shared channel (PDSCH) carries user data, broadcast system information not transmitted through the PBCH such as system information blocks (SIBs), and paging messages.

As illustrated in FIG. 2C, some of the REs carry DM-RS (indicated as R for one particular configuration, but other DM-RS configurations are possible) for channel estimation at the base station. The UE may transmit DM-RS for the physical uplink control channel (PUCCH) and DM-RS for the physical uplink shared channel (PUSCH). The PUSCH DM-RS may be transmitted in the first one or two symbols of the PUSCH. The PUCCH DM-RS may be transmitted in different configurations depending on whether short or long PUCCHs are transmitted and depending on the particular PUCCH format used. The UE may transmit sounding reference signals (SRS). The SRS may be transmitted in the last symbol of a subframe. The SRS may have a comb structure, and a UE may transmit SRS on one of the combs. The SRS may be used by a base station for channel quality estimation to enable frequency-dependent scheduling on the UL.

FIG. 2D illustrates an example of various UL channels within a subframe of a frame. The PUCCH may be located as indicated in one configuration. The PUCCH carries uplink control information (UCI), such as scheduling requests, a channel quality indicator (CQI), a precoding matrix indicator (PMI), a rank indicator (RI), and hybrid automatic repeat request (HARQ) acknowledgment (ACK) (HARQ-ACK) feedback (i.e., one or more HARQ ACK bits indicating one or more ACK and/or negative ACK (NACK)). The PUSCH carries data, and may additionally be used to carry a buffer status report (BSR), a power headroom report (PHR), and/or UCI.

Figure 3:
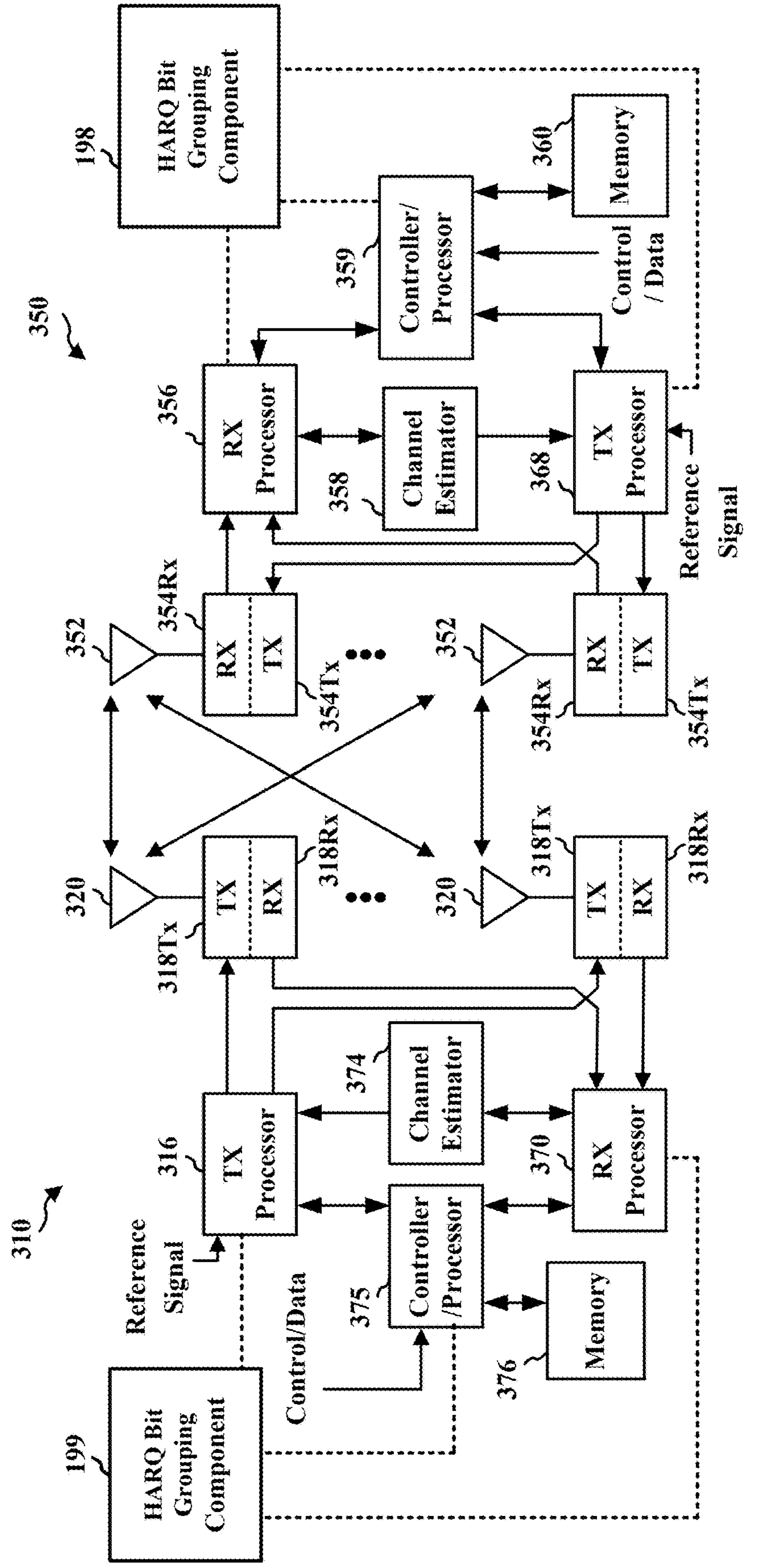
FIG. 3 is a diagram illustrating an example of a base station and user equipment (UE) in an access network.

FIG. 3 is a block diagram of a base station 310 in communication with a UE 350 in an access network. In the DL, Internet protocol (IP) packets may be provided to a controller/processor 375. The controller/processor 375 implements layer 3 and layer 2 functionality. Layer 3 includes a radio resource control (RRC) layer, and layer 2 includes a service data adaptation protocol (SDAP) layer, a packet data convergence protocol (PDCP) layer, a radio link control (RLC) layer, and a medium access control (MAC) layer. The controller/processor 375 provides RRC layer functionality associated with broadcasting of system information (e.g., MIB, SIBs), RRC connection control (e.g., RRC connection paging, RRC connection establishment, RRC connection modification, and RRC connection release), inter radio access technology (RAT) mobility, and measurement configuration for UE measurement reporting; PDCP layer functionality associated with header compression/decompression, security (ciphering, deciphering, integrity protection, integrity verification), and handover support functions; RLC layer functionality associated with the transfer of upper layer packet data units (PDUs), error correction through ARQ, concatenation, segmentation, and reassembly of RLC service data units (SDUs), re-segmentation of RLC data PDUs, and reordering of RLC data PDUs; and MAC layer functionality associated with mapping between logical channels and transport channels, multiplexing of MAC SDUs onto transport blocks (TBs), demultiplexing of MAC SDUs from TBs, scheduling information reporting, error correction through HARQ, priority handling, and logical channel prioritization.

The transmit (TX) processor 316 and the receive (RX) processor 370 implement layer 1 functionality associated with various signal processing functions. Layer 1, which includes a physical (PHY) layer, may include error detection on the transport channels, forward error correction (FEC) coding/decoding of the transport channels, interleaving, rate matching, mapping onto physical channels, modulation/demodulation of physical channels, and MIMO antenna processing. The TX processor 316 handles mapping to signal constellations based on various modulation schemes (e.g., binary phase-shift keying (BPSK), quadrature phase-shift keying (QPSK), M-phase-shift keying (M-PSK), M-quadrature amplitude modulation (M-QAM)). The coded and modulated symbols may then be split into parallel streams. Each stream may then be mapped to an OFDM subcarrier, multiplexed with a reference signal (e.g., pilot) in the time and/or frequency domain, and then combined together using an Inverse Fast Fourier Transform (IFFT) to produce a physical channel carrying a time domain OFDM symbol stream. The OFDM stream is spatially precoded to produce multiple spatial streams. Channel estimates from a channel estimator 374 may be used to determine the coding and modulation scheme, as well as for spatial processing. The channel estimate may be derived from a reference signal and/or channel condition feedback transmitted by the UE 350. Each spatial stream may then be provided to a different antenna 320 via a separate transmitter 318Tx. Each transmitter 318Tx may modulate a radio frequency (RF) carrier with a respective spatial stream for transmission.

At the UE 350, each receiver 354Rx receives a signal through its respective antenna 352. Each receiver 354Rx recovers information modulated onto an RF carrier and provides the information to the receive (RX) processor 356. The TX processor 368 and the RX processor 356 implement layer 1 functionality associated with various signal processing functions. The RX processor 356 may perform spatial processing on the information to recover any spatial streams destined for the UE 350. If multiple spatial streams are destined for the UE 350, they may be combined by the RX processor 356 into a single OFDM symbol stream. The RX processor 356 then converts the OFDM symbol stream from the time-domain to the frequency domain using a Fast Fourier Transform (FFT). The frequency domain signal includes a separate OFDM symbol stream for each subcarrier of the OFDM signal. The symbols on each subcarrier, and the reference signal, are recovered and demodulated by determining the most likely signal constellation points transmitted by the base station 310. These soft decisions may be based on channel estimates computed by the channel estimator 358. The soft decisions are then decoded and deinterleaved to recover the data and control signals that were originally transmitted by the base station 310 on the physical channel. The data and control signals are then provided to the controller/processor 359, which implements layer 3 and layer 2 functionality.

The controller/processor 359 can be associated with at least one memory 360 that stores program codes and data. The at least one memory 360 may be referred to as a computer-readable medium. In the UL, the controller/processor 359 provides demultiplexing between transport and logical channels, packet reassembly, deciphering, header decompression, and control signal processing to recover IP packets. The controller/processor 359 is also responsible for error detection using an ACK and/or NACK protocol to support HARQ operations.

Similar to the functionality described in connection with the DL transmission by the base station 310, the controller/processor 359 provides RRC layer functionality associated with system information (e.g., MIB, SIBs) acquisition, RRC connections, and measurement reporting; PDCP layer functionality associated with header compression/decompression, and security (ciphering, deciphering, integrity protection, integrity verification); RLC layer functionality associated with the transfer of upper layer PDUs, error correction through ARQ, concatenation, segmentation, and reassembly of RLC SDUs, re-segmentation of RLC data PDUs, and reordering of RLC data PDUs; and MAC layer functionality associated with mapping between logical channels and transport channels, multiplexing of MAC SDUs onto TBs, demultiplexing of MAC SDUs from TBs, scheduling information reporting, error correction through HARQ, priority handling, and logical channel prioritization.

Channel estimates derived by a channel estimator 358 from a reference signal or feedback transmitted by the base station 310 may be used by the TX processor 368 to select the appropriate coding and modulation schemes, and to facilitate spatial processing. The spatial streams generated by the TX processor 368 may be provided to different antenna 352 via separate transmitters 354Tx. Each transmitter 354Tx may modulate an RF carrier with a respective spatial stream for transmission.

The UL transmission is processed at the base station 310 in a manner similar to that described in connection with the receiver function at the UE 350. Each receiver 318Rx receives a signal through its respective antenna 320. Each receiver 318Rx recovers information modulated onto an RF carrier and provides the information to a RX processor 370.

The controller/processor 375 can be associated with at least one memory 376 that stores program codes and data. The at least one memory 376 may be referred to as a computer-readable medium. In the UL, the controller/processor 375 provides demultiplexing between transport and logical channels, packet reassembly, deciphering, header decompression, control signal processing to recover IP packets. The controller/processor 375 is also responsible for error detection using an ACK and/or NACK protocol to support HARQ operations.

At least one of the TX processor 368, the RX processor 356, and the controller/processor 359 may be configured to perform aspects in connection with the component 198 of FIG. 1.

At least one of the TX processor 316, the RX processor 370, and the controller/processor 375 may be configured to perform aspects in connection with the component 199 of FIG. 1.

A UE may provide HARQ feedback for DL transmissions received from a network node to indicate an acknowledgement or a negative acknowledgement of the DL transmissions for the network node. In some cases, the UE may provide an initial transmission of HARQ feedback and one or more retransmissions of the HARQ feedback. However, the BLER target for an initial transmission and a given retransmission may be very different and may correspond to different probability distributions for the respective HARQ-ACK bits. For example, the initial transmission may have a first BLER target and a corresponding probability distribution of HARQ bits, while a retransmission may have a lower BLER target and a corresponding probability distribution of HARQ bits that is more biased towards an ACK bit than the initial transmission (e.g., a higher probability than the initial transmission).

Figure 4:
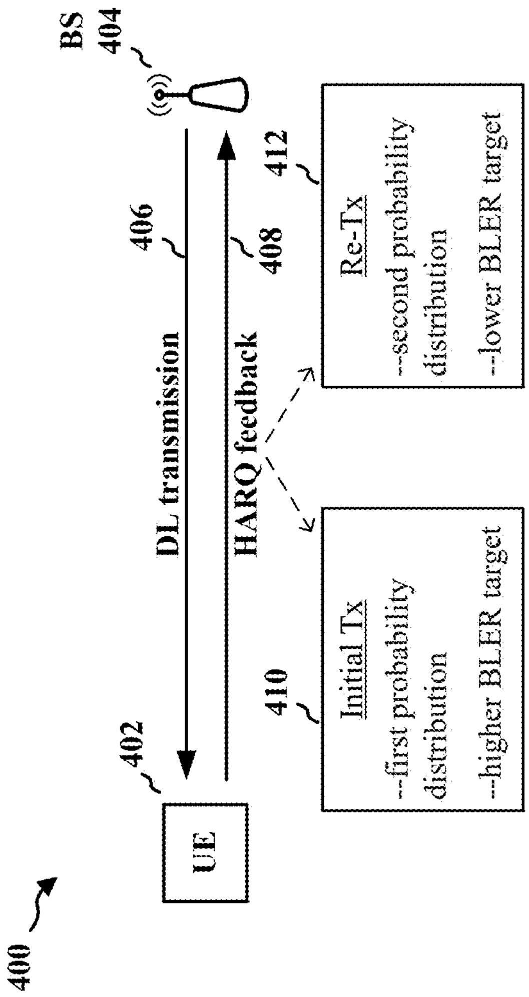
FIG. 4 is a diagram illustrating an example of HARQ feedback.

FIG. 4 is a diagram 400 illustrating an example of HARQ feedback. Diagram 400 shows a UE 402 that is configured to receive a DL transmission 406 (and/or multiple DL transmission), which a base station 404 may be configured to transmit/provide. The UE 402 may be configured to generate and then transmit/provide, and the base station 404 may be configured to receive, HARQ feedback 408 for the DL transmission 406. The base station 404 may be configured to decode the HARQ feedback 408 according to an UL channel coding by which the HARQ feedback 408 is transmitted/provided.

In some cases, the HARQ feedback 408 may be transmitted/provided multiple times, e.g., an initial transmission (Tx) and one or more retransmissions (Re-Tx). The BLER target for an initial Tx 410 and a Re-Tx 412 may be different and may correspond to different probability distributions for their respective HARQ-ACK bits. For example, if the initial Tx 410 has a 50% BLER target, then a HARQ-ACK bit will be an ACK with 50% probability, and the Re-Tx 412 (or more than one Re-Tx) will have a lower BLER target than the initial Tx 410, which in return may correspond to HARQ-ACK bits being an ACK with a higher probability in the Re-Tx 412. Likewise, the base station 404 may decode the HARQ feedback by assuming a prior of (0.5, 0.5) for the initial Tx 410 and use the Re-TX BLER target as the prior for the Re-Tx 412 HARQ bits.

Current HARQ feedback solutions lack mechanisms that utilize grouping to (i) take advantage of channel coding gains, and (ii) achieve decoding improvements as current solutions for decoders are limited to marginal distributions of HARQ feedback bits that suffer from performance loss.

Aspects herein enable a UE to group HARQ-ACK bits according to whether they belong to an initial transmission (Tx) or a retransmission (Re-Tx), in order for the receiver to be able to apply proper priors. The main issue is robustness to missing DCIs. It is difficult to ensure that both the base station/gNB and UE agree on which was the first transmission by using NDI without other indicators. The aspects herein provide two potential solutions: using the RV index and splitting the DAI. Furthermore, the mapping of the grouped bits to the channel coding is optimized based on the grouping. Aspects herein provide for grouping HARQ-ACK bits based on retransmission (Re-Tx) number provide improvements to the issues noted above. Aspects improve coding gains by grouping HARQ feedback bits with the same distribution together during channel code mapping. Aspects also provide improved knowledge of prior HARQ feedback bits over marginal distributions for decoding by grouping HARQ feedback bits with the same distribution together during channel code mapping.

Figure 5:
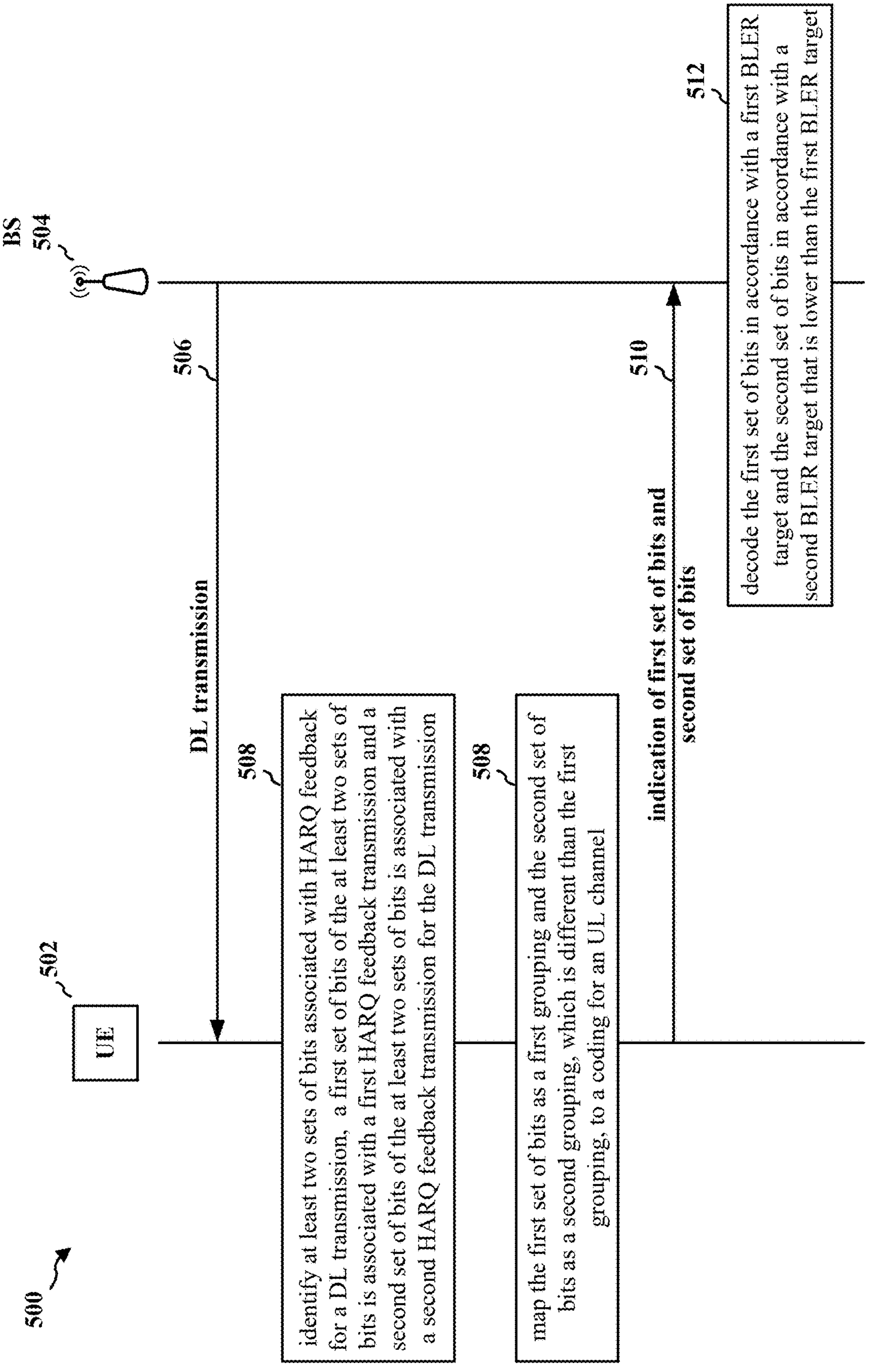
FIG. 5 is a call flow diagram for wireless communications, in accordance with various aspects of the present disclosure.

FIG. 5 is a call flow diagram 500 for wireless communications, in various aspects. Call flow diagram 500 illustrates grouping HARQ-ACK bits/HARQ feedback based on retransmission number for a UE (e.g., a UE 502), by way of example, that communicates with a base station (e.g., another UE, another base station, etc., as shown and described herein), by way of example. Aspects described for base stations, and for network nodes/entities herein, generally, may be performed in aggregated form and/or by one or more components in disaggregated form. Additionally, or alternatively, the aspects may be performed by a UE autonomously, in addition to, and/or in lieu of, operations of a base station.

In the illustrated aspect, the UE 502 may be configured to receive, and the base station 504 may be configured to transmit/provide, a DL transmission 506. The UE 502 may be configured to identify (at 508) at least two sets of bits associated with HARQ feedback for the DL transmission 506 from a network node (e.g., the base station 504). A first set of bits of the at least two sets of bits may be associated with a first HARQ feedback transmission and a second set of bits of the at least two sets of bits may be associated with a second HARQ feedback transmission for the DL transmission 506. The first HARQ feedback transmission may be an initial Tx or a Re-Tx, and the second HARQ feedback transmission may be a Re-Tx. In aspects, the first set of bits may be associated with a first probability distribution and the second set of bits may be associated with a second probability distribution that is different than the first probability distribution.

In aspects, the UE 502 may be configured to identify (at 508) the at least two sets of bits associated with the HARQ feedback based on at least one of a new data indication (NDI), a redundancy version (RV) value, a DL assignment index (DAI) (e.g., in a PDSCH), or an index indication of a retransmission index (e.g., a unique and/or dedicated Re-Tx index field) associated with the at least two sets of bits. In aspects, the NDI may include a first NDI indicative of the first set of bits associated with the first HARQ feedback transmission being an initial HARQ feedback transmission and a second NDI indicative of the second set of bits associated with the second HARQ feedback transmission being a retransmission of the initial HARQ feedback transmission. In aspects, the RV value may include a first RV value indicative of the first set of bits associated with the first HARQ feedback transmission being an initial HARQ feedback transmission and a second RV value, from a set of RV values, indicative of the second set of bits associated with the second HARQ feedback transmission being a retransmission of the initial HARQ feedback transmission, where the second RV value is different than the first RV value. In some aspects, the first RV value may be zero and the set of RV values may include values including at least one of: one (1), two (2), or three (3). The at least two sets of bits associated with the HARQ feedback for the DL transmission 506 may include a third set of bits (or a third and a fourth set of bits) associated with a third HARQ feedback transmission (or a third and a fourth HARQ feedback transmission). In such aspects, the RV value may include a third RV value (and also a fourth RV value), from the set of RV values, which may be indicative of the third set of bits (and also the fourth set of bits) associated with the third HARQ feedback transmission (and also the fourth HARQ feedback transmission) being an additional retransmission(s) of the initial HARQ feedback transmission. The third RV value may be different than both the first RV value and the second RV value; likewise, a fourth RV value may be different than each other RV value. In aspects, the DAI may include a first DAI indicative of a first count for a first DL grant associated with the first set of bits and the first HARQ feedback transmission and a second DAI indicative of a second count for a second DL grant associated with the second set of bits and the second HARQ feedback transmission. The second count may be different than the first count, and the first HARQ feedback transmission may be an initial HARQ feedback transmission, while the second HARQ feedback transmission may be a retransmission Re-Tx of the initial HARQ feedback transmission.

The UE 502 may be configured to map (at 508) the first set of bits as a first grouping and the second set of bits as a second grouping, which is different than the first grouping, to a coding for an UL channel. For example, the first grouping may be associated with an initial Tx of HARQ feedback bits and the second grouping may be associated with a Re-Tx of HARQ feedback bits for the DL transmission 506, in some aspects, while in other aspects, the first and second groupings may each be associated with Re-Tx of HARQ feedback bits for the DL transmission 506. The UE 502 may be configured to map (at 508) the first and second groupings to the coding for the UL channel in order to improve coding gain and/or to improve decoding. The mapping (at 510) to the UL channel coding may vary, in aspects, based on the type of coding utilized.

In one example, the coding is a Reed-Muller (RM) coding, and to transmit/provide the indication 510 of the first set of bits and the second set of bits in accordance with the first grouping and the second grouping, the UE 502 may be configured to include the first set of bits at an initial position in accordance with the coding, and append the second set of bits at a subsequent position in accordance with the coding. The initial position may be associated with a higher reliability for the coding than the subsequent position, in such aspects.

In another example, the coding may be a polar coding, and to transmit/provide the indication 510 of the first set of bits and the second set of bits in accordance with the first grouping and the second grouping, the UE 502 may be configured to include the second set of bits at an initial position in accordance with the coding, and append the first set of bits at a subsequent position in accordance with the coding. The initial position may be associated with a lower reliability for the coding than the subsequent position, in such aspects.

The UE 502 may be configured to transmit/provide, and the network node (e.g., the base station 504) may be configured to receive, with the coding via the UL channel, an indication 510 of the first set of bits and the second set of bits in accordance with the first grouping and the second grouping. Subsequent to receiving the indication 510, the network node (e.g., the base station 504) may be configured to decode (at 512) the first set of bits in accordance with a first BLER target and the second set of bits in accordance with a second BLER target that is lower than the first BLER target. The first set of bits may be associated with a first probability distribution and the second set of bits may be associated with a second probability distribution that is different than the first probability distribution.

Figure 6:
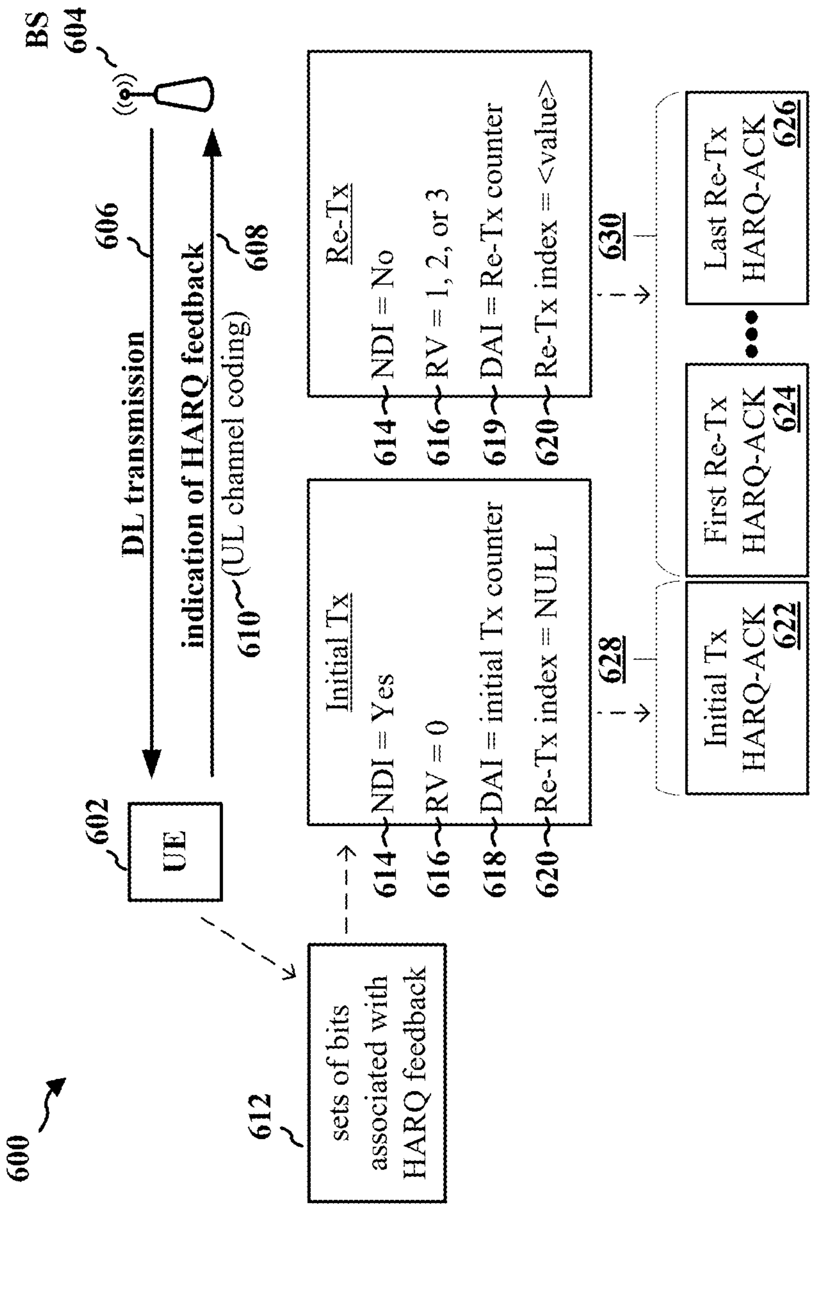
FIG. 6 is a diagram illustrating an example of HARQ bit grouping, in accordance with various aspects of the present disclosure.

FIG. 6 is a diagram 600 illustrating an example of HARQ bit grouping, in various aspects. Diagram 600 is shown with reference to a UE 602 that may communicate with a network node (e.g., a base station 604, a gNB, etc.). The UE 602 may be configured to receive, from the base station 604, a DL transmission 606, and to transmit/provide, for the base station 604 and according to an UL channel coding 610 (e.g., with the coding via the UL channel), an indication 608 of HARQ feedback (e.g., a first set of bits and a second set of bits respectively associated with a first HARQ feedback transmission and a second HARQ feedback transmission) for the DL transmission 606. Diagram 600 may be an aspect of call flow diagram 500 in FIG. 5.

As described herein, a UE (e.g., the UE 602) may be configured to identify at least two sets of bits 612 (e.g., two, three, four, etc., sets of bits) associated with HARQ feedback for the DL transmission 606. In aspects, the UE 602 may identify the at least two sets of bits 612 associated with the HARQ feedback based one or more of an NDI 614, an RV value 616, a DAI (e.g., in a PDSCH) such as a DAI 618 for an initial Tx counter and a DAI 619 for an Re-Tx counter that is separate from the DAI 618, an index indication 620 of a retransmission index (e.g., a unique and/or dedicated Re-Tx index field), and/or the like associated with the at least two sets of bits 612.

In aspects, the UE 602 may be configured to determine/identify whether a HARQ feedback transmission is initial Tx or a Re-Tx based on a detected NDI value for the NDI 614. For example, when the NDI 614 is toggled or indicates "yes," the HARQ feedback transmission may be an initial Tx and may be grouped according, whereas, when the NDI 614 is not toggled or indicates "no," the HARQ feedback transmission may be a Re-Tx.

Alternatively or additionally, the UE 602 may be configured to determine/identify a grouping based on an RV value 616 (e.g., an RV index). For example, when the RV value 616 indicates a value of zero (0 or RV0), this may be an indication/proxy for an initial Tx, whereas, when the RV value 616 indicates a value of one, two, or three (1, 2, 3; or RV1, RV2, RV3), this may be an indication of a Re-Tx. In aspects, such value identifications/determinations may be sufficient to discern between an initial Tx and a Re-Tx with high probability. In aspects, as noted herein, there may be more than two groups based on more than two sets of bits (e.g., two or more Re-Tx HARQ feedback instances, and in such aspects, if groupings are based at least in part on the RV value 616, then each RV value 616 may have its own group.

Alternatively or additionally, and with reference to dynamic codebook construction (e.g., a Type-2 HARQ-ACK codebook in NR), the DAI mechanism may be utilized so that the UE 602 and the base station 604 are enabled to identify the HARQ codebook size, even in scenarios where the UE 602 misses one or more of the DL grants from the base station 604. In aspects, and in accordance with the groupings based on sets of bits for initial Tx and Re-Tx, if the UE 602 misses a DL grant, the UE 602 may be indicated of whether the missing DL grant is associated with the initial Tx or is associated with a Re-Tx. In such cases, aspects provide for the DAI to be counted separately for the initial Tx versus the Re-Tx. As one example, the base station 604 may be configured to indicate the DAI 618 separately for the group of bits associated with the initial TX from the DAI 618 for the group of bits associated with the Re-Tx.

Alternatively or additionally, the index indication 620 may indicate a Rx-Tx index associated with the at least two sets of bits (e.g., respectively). The index indication 620 may be a unique and/or dedicated Re-Tx index field provided by the base station 604 to the UE 602. As one example, an initial Tx may not have an associated value (e.g., may be NULL) for the index indication 620 of the Rx-Tx index, while a Rx-TX may have an associated value for the index indication 620 of the Rx-Tx index.

Accordingly, the at least two sets of bits 612 associated with HARQ feedback for the DL transmission 606 may be identified and grouped. As shown, a first set of bits 622, a second set of bits 624, and a last set of bits 626 (e.g., a third or a fourth set of bits) of the at least two sets of bits 612 associated with HARQ feedback for the DL transmission 606 may be identified and grouped into a grouping 628 for an initial Tx HARQ feedback and a grouping(s) 630 for Re-Tx HARQ feedback. The grouping 628 and the grouping(s) 630 may be respectively mapped by the UE 602 to the UL channel coding 610 for transmission of the indication 608 to the base station 604.

Figure 7:
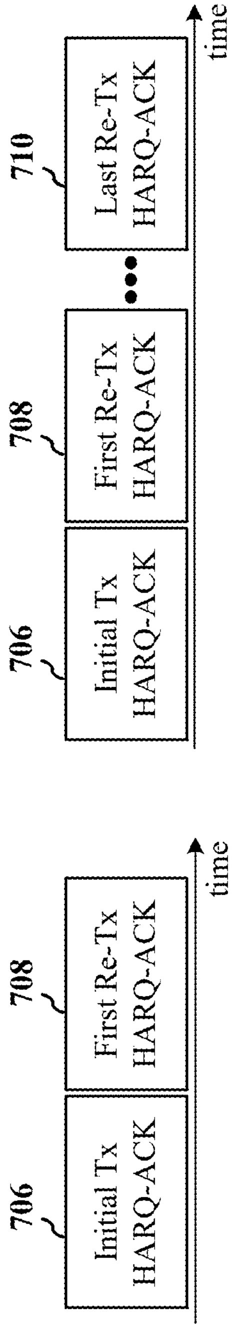
FIG. 7 is a diagram illustrating an example of HARQ bit grouping for channel coding, in accordance with various aspects of the present disclosure.

FIG. 7 is a diagram 700 illustrating an example of HARQ bit grouping for channel coding, in various aspects. Diagram 700 shows an RM coding 704 in relation to a coding table 702 that illustrates minimum Hamming distances for Golay, RM, and PC-polar codes (e.g., given different values for N, K), and may be an aspect of the call flow diagram 500 in FIG. 5 and/or the diagram 600 in FIG. 6.

As shown, the RM coding 704 may have an N=32 parameter for K=3 to 11. After grouping, a UE may be configured to map sets of bits associated with HARQ feedback for a DL transmission. In cases for RM coding (e.g., coding for an UL channel by which HARQ feedback will be transmitted), the UE may include/put initial Tx HARQ-ACK bits 706 to the beginning and append the group for first Re-Tx HARQ-ACK bits 708 (e.g., the Re-Tx bits in a case with a single Re-Tx) after the initial Tx HARQ-ACK bits 706 in order to map the initial Tx HARQ-ACK bits 706 to a better code (with larger minimum distance). Similarly, the UE may include/put the initial Tx HARQ-ACK bits 706 to the beginning and append the groups based on their Re-Tx number (e.g., if more than 2 groups, such as: in sequence from the first Re-Tx HARQ-ACK bits 708 to last Re-Tx HARQ-ACK bits 710 (a second or third set of Re-Tx bits)) in order to map the initial Tx HARQ-ACK bits 706 to a better code (with larger minimum distance). That is, for the RM code 704, the initial positioning may offer a greater minimum distance, and thus a better reliability/higher probability distribution, than later positions. Accordingly, the initial position of the first set of bits 706 may be associated with a higher reliability of the location reliability 705 based on being encoded into a first subcode (e.g., an encoding into the first subcode) having a larger minimum distance for the RM code 704 (e.g., the RM coding) than a second subcode that encodes the second set of bits 708 of the subsequent position.

Figure 8:
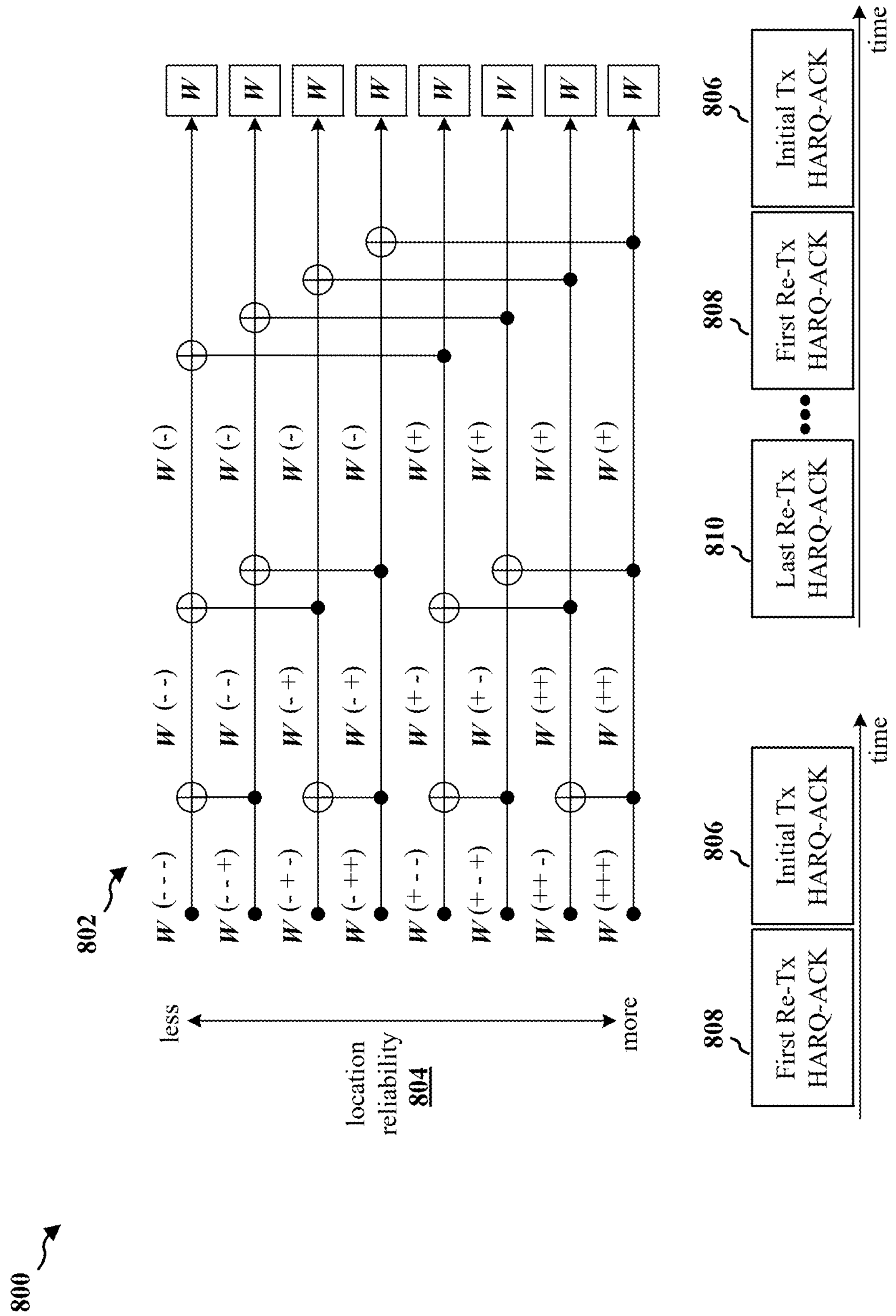
FIG. 8 is a diagram illustrating an example of HARQ bit grouping for channel coding, in accordance with various aspects of the present disclosure.

FIG. 8 is a diagram 800 illustrating an example of HARQ bit grouping for channel coding, in various aspects. Diagram 800 shows a polar coding 802 in relation to a location reliability 804 associated with locations/positions in the polar coding 802, and may be an aspect of the call flow diagram 500 in FIG. 5 and/or the diagram 600 in FIG. 6.

As shown, the polar coding 802 may have less reliability at initial positions therein for the location reliability 804, while having more reliability at later positions therein for the location reliability 804. After grouping, a UE may be configured to map sets of bits associated with HARQ feedback for a DL transmission. In cases for polar coding and the polar coding 802 (e.g., coding for an UL channel by which HARQ feedback will be transmitted), the UE may include/put first Re-Tx HARQ-ACK bits 808 (e.g., the Re-Tx bits in a case with a single Re-Tx) to the beginning positions (with lower values for the location reliability 804) and append the group for initial Tx HARQ-ACK bits 806 after the first Re-Tx HARQ-ACK bits 808 in order to map the initial Tx HARQ-ACK bits 806 to a better code (with higher values for the location reliability 804). Similarly, the UE may include/put last Re-Tx HARQ-ACK bits 810 to the beginning and append the Re-Tx groups based on their Re-Tx number (e.g., if more than 2 groups, such as: in reverse sequence from the last Re-Tx HARQ-ACK bits 810 (a second or third set of Re-Tx bits) to the first Re-Tx HARQ-ACK bits 808) to map the initial Tx HARQ-ACK bits 806 to a better code (with higher values for the location reliability 804). That is, for the polar code 802, as a standard polar code structure, this corresponds to placing any Re-Tx HARQ-ACK bits before the initial Tx HARQ-ACK bits 806. Accordingly, the subsequent position of the first set of bits 806 may be associated with a higher reliability (of the location reliability 804) for the polar coding 802 than the initial position of the second set of bits 808.

Figure 9:
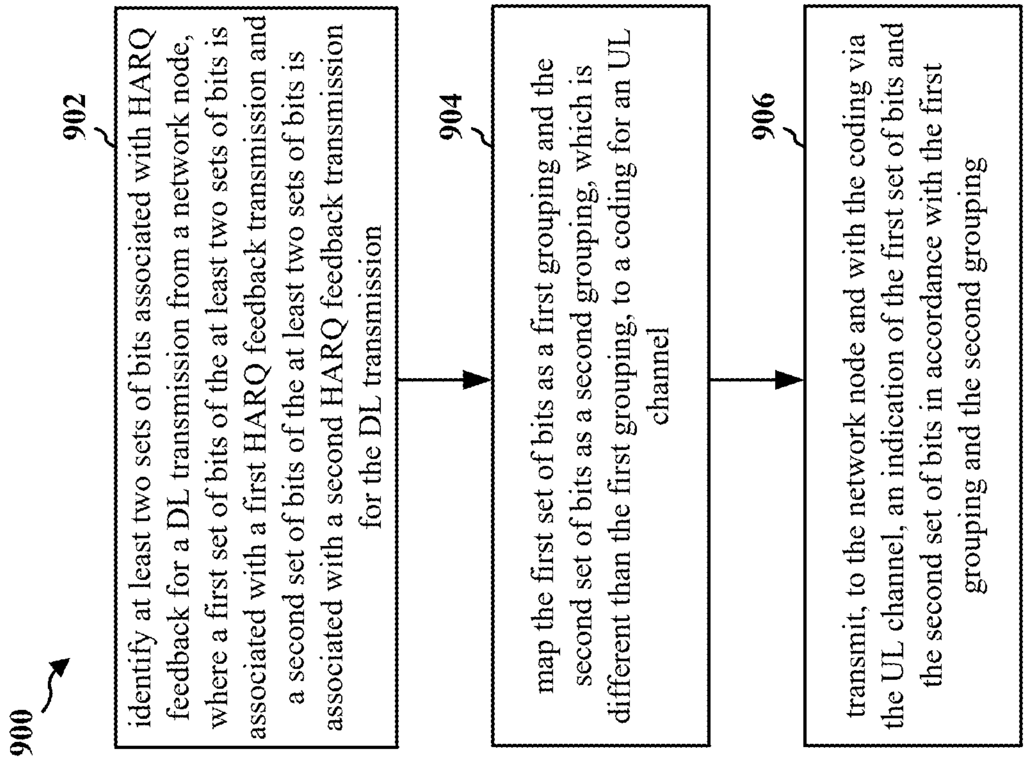
FIG. 9 is a flowchart of a method of wireless communication.

FIG. 9 is a flowchart 900 of a method of wireless communication. The method may be performed by a UE (e.g., the UE 104, 402, 502, 602; the apparatus 1204). In some aspects, the method may include aspects described in connection with the communication flow in FIG. 5, and/or aspects described in FIGS. 4, 6, 7, 8. The method may be for grouping HARQ-ACK bits based on retransmission number. The method may improve coding gains and provide improved knowledge of prior HARQ feedback bits over marginal distributions for decoding by grouping HARQ feedback bits with the same distribution together during channel code mapping.

At 902, the UE identifies at least two sets of bits associated with HARQ feedback for a DL transmission from a network node, where a first set of bits of the at least two sets of bits is associated with a first HARQ feedback transmission and a second set of bits of the at least two sets of bits is associated with a second HARQ feedback transmission for the DL transmission. For example, the identification may be performed by one or more of the component 198, the transceiver(s) 1222, and/or the antenna 1280 in FIG. 12. FIG. 5 illustrates, in the context of FIGS. 6, 7, 8, an example of the UE 502 identifying such sets of bits associated with HARQ feedback for a DL transmission from a network node (e.g., from the base station 504).

The UE 502 may be configured to receive, and the base station 504 may be configured to transmit/provide, a DL transmission 506 (e.g., 606 in FIG. 6). The UE 502 may be configured to identify (at 508) at least two sets of bits (e.g., 612 in FIG. 6) associated with HARQ feedback for the DL transmission 506 (e.g., 606 in FIG. 6) from a network node (e.g., the base station 504). A first set of bits (e.g., 622 in FIG. 6; 706 in FIG. 7; 806 in FIG. 8) of the at least two sets of bits (e.g., 612 in FIG. 6) may be associated with a first HARQ feedback transmission and a second set of bits (e.g., 624, 626 in FIG. 6; 708, 710 in FIG. 7; 808, 810 in FIG. 8) of the at least two sets of bits (e.g., 612 in FIG. 6) may be associated with a second HARQ feedback transmission for the DL transmission 506 (e.g., 606 in FIG. 6). The first HARQ feedback transmission may be an initial Tx or a Re-Tx, and the second HARQ feedback transmission may be a Re-Tx. In aspects, the first set of bits (e.g., 622 in FIG. 6; 706 in FIG. 7; 806 in FIG. 8) may be associated with a first probability distribution (e.g., 410 in FIG. 4; 705 in FIG. 7; 804 in FIG. 8) and the second set of bits (e.g., 624, 626 in FIG. 6; 708, 710 in FIG. 7; 808, 810 in FIG. 8) may be associated with a second probability distribution (e.g., 412 in FIG. 4; 705 in FIG. 7; 804 in FIG. 8) that is different than the first probability distribution (e.g., 410 in FIG. 4; 705 in FIG. 7; 804 in FIG. 8). In aspects, the UE 502 may be configured to identify (at 508) the at least two sets of bits (e.g., 612 in FIG. 6) associated with the HARQ feedback based on at least one of a new data indication (NDI) (e.g., 614 in FIG. 6), a redundancy version (RV) value (e.g., 616 in FIG. 6), a DL assignment index (DAI) (e.g., 618, 619 in FIG. 6) (e.g., in a PDSCH), or an index indication (e.g., 620 in FIG. 6) of a retransmission index (e.g., a unique and/or dedicated Re-Tx index field) associated with the at least two sets of bits (e.g., 612 in FIG. 6). In aspects, the NDI (e.g., 614 in FIG. 6) may include a first NDI (e.g., 614 in FIG. 6) indicative of the first set of bits (e.g., 622 in FIG. 6; 706 in FIG. 7; 806 in FIG. 8) associated with the first HARQ feedback transmission being an initial HARQ feedback transmission and a second NDI (e.g., 614 in FIG. 6) indicative of the second set of bits (e.g., 624, 626 in FIG. 6; 708, 710 in FIG. 7; 808, 810 in FIG. 8) associated with the second HARQ feedback transmission being a retransmission of the initial HARQ feedback transmission. In aspects, the RV value (e.g., 616 in FIG. 6) may include a first RV value (e.g., 616 in FIG. 6) indicative of the first set of bits (e.g., 622 in FIG. 6; 706 in FIG. 7; 806 in FIG. 8) associated with the first HARQ feedback transmission being an initial HARQ feedback transmission and a second RV value (e.g., 616 in FIG. 6), from a set of RV values, indicative of the second set of bits (e.g., 624, 626 in FIG. 6; 708, 710 in FIG. 7; 808, 810 in FIG. 8) associated with the second HARQ feedback transmission being a retransmission of the initial HARQ feedback transmission, where the second RV value (e.g., 616 in FIG. 6) is different than the first RV value (e.g., 616 in FIG. 6). In some aspects, the first RV value (e.g., 616 in FIG. 6) may be zero and the set of RV values may include values including at least one of: one (1), two (2), or three (3). The at least two sets of bits (e.g., 612 in FIG. 6) associated with the HARQ feedback for the DL transmission 506 (e.g., 606 in FIG. 6) may include a third set of bits (or a third and a fourth set of bits) associated with a third HARQ feedback transmission (or a third and a fourth HARQ feedback transmission). In such aspects, the RV value (e.g., 616 in FIG. 6) may include a third RV value (e.g., 616 in FIG. 6) (and also a fourth RV value), from the set of RV values, which may be indicative of the third set of bits (and also the fourth set of bits) associated with the third HARQ feedback transmission (and also the fourth HARQ feedback transmission) being an additional retransmission(s) of the initial HARQ feedback transmission. The third RV value (e.g., 616 in FIG. 6) may be different than both the first RV value (e.g., 616 in FIG. 6) and the second RV value (e.g., 616 in FIG. 6); likewise, a fourth RV value (e.g., 616 in FIG. 6) may be different than each other RV value (e.g., 616 in FIG. 6). In aspects, the DAI (e.g., 618, 619 in FIG. 6) may include a first DAI (e.g., 618, 619 in FIG. 6) indicative of a first count for a first DL grant associated with the first set of bits (e.g., 622 in FIG. 6; 706 in FIG. 7; 806 in FIG. 8) and the first HARQ feedback transmission and a second DAI (e.g., 618, 619 in FIG. 6) indicative of a second count for a second DL grant associated with the second set of bits (e.g., 624, 626 in FIG. 6; 708, 710 in FIG. 7; 808, 810 in FIG. 8) and the second HARQ feedback transmission. The second count may be different than the first count, and the first HARQ feedback transmission may be an initial HARQ feedback transmission, while the second HARQ feedback transmission may be a retransmission Re-Tx of the initial HARQ feedback transmission.

At 904, the UE maps the first set of bits as a first grouping and the second set of bits as a second grouping, which is different than the first grouping, to a coding for an UL channel. For example, the mapping may be performed by one or more of the component 198, the transceiver(s) 1222, and/or the antenna 1280 in FIG. 12. FIG. 5 illustrates, in the context of FIGS. 6, 7, 8, an example of the UE 502 mapping such sets of bits as groupings for transmission of HARQ feedback to a network node (e.g., the base station 504).

The UE 502 may be configured to map (at 508) the first set of bits (e.g., 622 in FIG. 6; 706 in FIG. 7; 806 in FIG. 8) as a first grouping and the second set of bits (e.g., 624, 626 in FIG. 6; 708, 710 in FIG. 7; 808, 810 in FIG. 8) as a second grouping, which is different than the first grouping, to a coding (e.g., 610 in FIG. 6) for an UL channel. For example, the first grouping may be associated with an initial Tx of HARQ feedback bits and the second grouping may be associated with a Re-Tx of HARQ feedback bits for the DL transmission 506 (e.g., 606 in FIG. 6), in some aspects, while in other aspects, the first and second groupings may each be associated with Re-Tx of HARQ feedback bits for the DL transmission 506 (e.g., 606 in FIG. 6). The UE 502 may be configured to map (at 508) the first and second groupings to the coding (e.g., 610 in FIG. 6) for the UL channel in order to improve coding gain and/or to improve decoding. The mapping (at 510) to the UL channel coding (e.g., 610 in FIG. 6) may vary, in aspects, based on the type of coding (e.g., 610 in FIG. 6) utilized. In one example, the coding (e.g., 610 in FIG. 6) is an RM coding (e.g., 704 in FIG. 7), and to transmit/provide the indication 510 of the first set of bits (e.g., 622 in FIG. 6; 706 in FIG. 7; 806 in FIG. 8) and the second set of bits (e.g., 624, 626 in FIG. 6; 708, 710 in FIG. 7; 808, 810 in FIG. 8) in accordance with the first grouping and the second grouping, the UE 502 may be configured to include the first set of bits (e.g., 622 in FIG. 6; 706 in FIG. 7; 806 in FIG. 8) at an initial position in accordance with the coding (e.g., 610 in FIG. 6), and append the second set of bits (e.g., 624, 626 in FIG. 6; 708, 710 in FIG. 7; 808, 810 in FIG. 8) at a subsequent position in accordance with the coding (e.g., 610 in FIG. 6). The initial position may be associated with a higher reliability (e.g., 705 in FIG. 7; 804 in FIG. 8) for the coding (e.g., 610 in FIG. 6) than the subsequent position, in such aspects. In another example, the coding (e.g., 610 in FIG. 6) may be a polar coding (e.g., 802 in FIG. 8), and to transmit/provide the indication 510 of the first set of bits (e.g., 622 in FIG. 6; 706 in FIG. 7; 806 in FIG. 8) and the second set of bits (e.g., 624, 626 in FIG. 6; 708, 710 in FIG. 7; 808, 810 in FIG. 8) in accordance with the first grouping and the second grouping, the UE 502 may be configured to include the second set of bits (e.g., 624, 626 in FIG. 6; 708, 710 in FIG. 7; 808, 810 in FIG. 8) at an initial position in accordance with the coding (e.g., 610 in FIG. 6), and append the first set of bits (e.g., 622 in FIG. 6; 706 in FIG. 7; 806 in FIG. 8) at a subsequent position in accordance with the coding (e.g., 610 in FIG. 6). The initial position may be associated with a lower reliability (e.g., 705 in FIG. 7; 804 in FIG. 8) for the coding than the subsequent position, in such aspects.

At 906, the UE transmits, to the network node and with the coding via the UL channel, an indication of the first set of bits and the second set of bits in accordance with the first grouping and the second grouping. For example, the transmission may be performed by one or more of the component 198, the transceiver(s) 1222, and/or the antenna 1280 in FIG. 12. FIG. 5 illustrates, in the context of FIGS. 6, 7, 8, an example of the UE 502 transmitting such an indication to a network node (e.g., the base station 504).

The UE 502 may be configured to transmit/provide, and the network node (e.g., the base station 504) may be configured to receive, with the coding (e.g., 610 in FIG. 6) via the UL channel, an indication 510 of the first set of bits (e.g., 622 in FIG. 6; 706 in FIG. 7; 806 in FIG. 8) and the second set of bits (e.g., 624, 626 in FIG. 6; 708, 710 in FIG. 7; 808, 810 in FIG. 8) in accordance with the first grouping and the second grouping. Subsequent to receiving the indication 510, the network node (e.g., the base station 504) may be configured to decode (at 512) the first set of bits (e.g., 622 in FIG. 6; 706 in FIG. 7; 806 in FIG. 8) in accordance with a first BLER target and the second set of bits (e.g., 624, 626 in FIG. 6; 708, 710 in FIG. 7; 808, 810 in FIG. 8) in accordance with a second BLER target that is lower than the first BLER target. The first set of bits (e.g., 622 in FIG. 6; 706 in FIG. 7; 806 in FIG. 8) may be associated with a first probability distribution (e.g., 410 in FIG. 4; 705 in FIG. 7; 804 in FIG. 8) and the second set of bits (e.g., 624, 626 in FIG. 6; 708, 710 in FIG. 7; 808, 810 in FIG. 8) may be associated with a second probability distribution (e.g., 412 in FIG. 4; 705 in FIG. 7; 804 in FIG. 8) that is different than the first probability distribution (e.g., 410 in FIG. 4; 705 in FIG. 7; 804 in FIG. 8).

Figure 10:
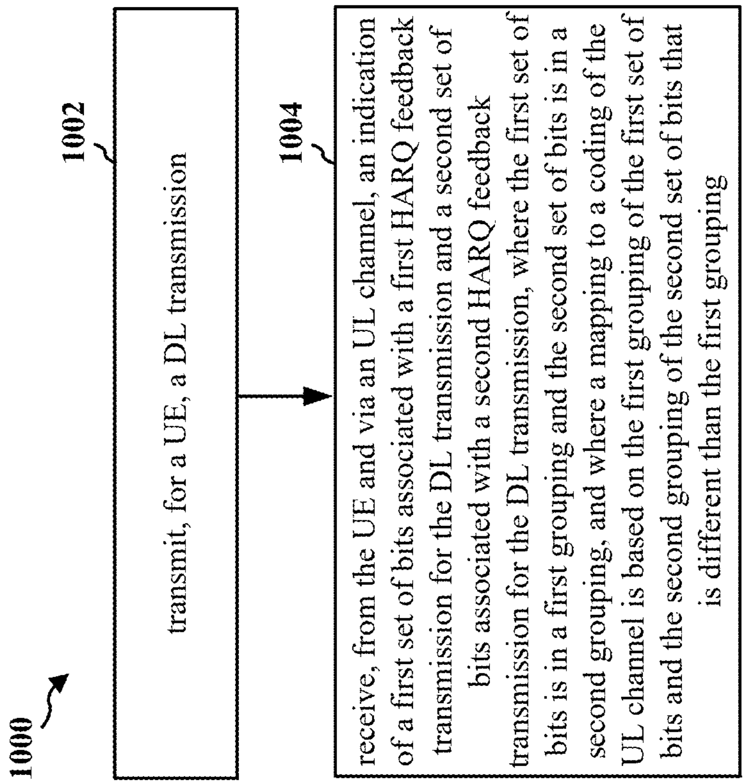
FIG. 10 is a flowchart of a method of wireless communication.

FIG. 10 is a flowchart 1000 of a method of wireless communication. The method may be performed by a network node such as a base station, a gNB, etc. (e.g., the base station 102, 404, 504, 604; the network entity 1202, 1302). In some aspects, the method may include aspects described in connection with the communication flow in FIG. 5, and/or aspects described in FIGS. 4, 6, 7, 8. The method may be for grouping HARQ-ACK bits based on retransmission number. The method may improve coding gains and provide improved knowledge of prior HARQ feedback bits over marginal distributions for decoding by grouping HARQ feedback bits with the same distribution together during channel code mapping.

At 1002, the network node transmits, for a UE, a DL transmission. For example, the transmission may be performed by one or more of the component 199, the transceiver(s) 1346, and/or the antenna 1380 in FIG. 13. FIG. 5 illustrates, in the context of FIGS. 6, 7, 8, an example of a network node (e.g., the base station 504) transmitting such a DL transmission to a UE (e.g., the UE 502).

The UE 502 may be configured to receive, and the base station 504 may be configured to transmit/provide, a DL transmission 506 (e.g., 606 in FIG. 6). The UE 502 may be configured to identify (at 508) at least two sets of bits (e.g., 612 in FIG. 6) associated with HARQ feedback for the DL transmission 506 (e.g., 606 in FIG. 6) from a network node (e.g., the base station 504). A first set of bits (e.g., 622 in FIG. 6; 706 in FIG. 7; 806 in FIG. 8) of the at least two sets of bits (e.g., 612 in FIG. 6) may be associated with a first HARQ feedback transmission and a second set of bits (e.g., 624, 626 in FIG. 6; 708, 710 in FIG. 7; 808, 810 in FIG. 8) of the at least two sets of bits (e.g., 612 in FIG. 6) may be associated with a second HARQ feedback transmission for the DL transmission 506 (e.g., 606 in FIG. 6). The first HARQ feedback transmission may be an initial Tx or a Re-Tx, and the second HARQ feedback transmission may be a Re-Tx. In aspects, the first set of bits (e.g., 622 in FIG. 6; 706 in FIG. 7; 806 in FIG. 8) may be associated with a first probability distribution (e.g., 410 in FIG. 4; 705 in FIG. 7; 804 in FIG. 8) and the second set of bits (e.g., 624, 626 in FIG. 6; 708, 710 in FIG. 7; 808, 810 in FIG. 8) may be associated with a second probability distribution (e.g., 412 in FIG. 4; 705 in FIG. 7; 804 in FIG. 8) that is different than the first probability distribution (e.g., 410 in FIG. 4; 705 in FIG. 7; 804 in FIG. 8). In aspects, the UE 502 may be configured to identify (at 508) the at least two sets of bits (e.g., 612 in FIG. 6) associated with the HARQ feedback based on at least one of a new data indication (NDI) (e.g., 614 in FIG. 6), a redundancy version (RV) value (e.g., 616 in FIG. 6), a DL assignment index (DAI) (e.g., 618, 619 in FIG. 6) (e.g., in a PDSCH), or an index indication (e.g., 620 in FIG. 6) of a retransmission index (e.g., a unique and/or dedicated Re-Tx index field) associated with the at least two sets of bits (e.g., 612 in FIG. 6). In aspects, the NDI (e.g., 614 in FIG. 6) may include a first NDI (e.g., 614 in FIG. 6) indicative of the first set of bits (e.g., 622 in FIG. 6; 706 in FIG. 7; 806 in FIG. 8) associated with the first HARQ feedback transmission being an initial HARQ feedback transmission and a second NDI (e.g., 614 in FIG. 6) indicative of the second set of bits (e.g., 624, 626 in FIG. 6; 708, 710 in FIG. 7; 808, 810 in FIG. 8) associated with the second HARQ feedback transmission being a retransmission of the initial HARQ feedback transmission. In aspects, the RV value (e.g., 616 in FIG. 6) may include a first RV value (e.g., 616 in FIG. 6) indicative of the first set of bits (e.g., 622 in FIG. 6; 706 in FIG. 7; 806 in FIG. 8) associated with the first HARQ feedback transmission being an initial HARQ feedback transmission and a second RV value (e.g., 616 in FIG. 6), from a set of RV values, indicative of the second set of bits (e.g., 624, 626 in FIG. 6; 708, 710 in FIG. 7; 808, 810 in FIG. 8) associated with the second HARQ feedback transmission being a retransmission of the initial HARQ feedback transmission, where the second RV value (e.g., 616 in FIG. 6) is different than the first RV value (e.g., 616 in FIG. 6). In some aspects, the first RV value (e.g., 616 in FIG. 6) may be zero and the set of RV values may include values including at least one of: one (1), two (2), or three (3). The at least two sets of bits (e.g., 612 in FIG. 6) associated with the HARQ feedback for the DL transmission 506 (e.g., 606 in FIG. 6) may include a third set of bits (or a third and a fourth set of bits) associated with a third HARQ feedback transmission (or a third and a fourth HARQ feedback transmission). In such aspects, the RV value (e.g., 616 in FIG. 6) may include a third RV value (e.g., 616 in FIG. 6) (and also a fourth RV value), from the set of RV values, which may be indicative of the third set of bits (and also the fourth set of bits) associated with the third HARQ feedback transmission (and also the fourth HARQ feedback transmission) being an additional retransmission(s) of the initial HARQ feedback transmission. The third RV value (e.g., 616 in FIG. 6) may be different than both the first RV value (e.g., 616 in FIG. 6) and the second RV value (e.g., 616 in FIG. 6); likewise, a fourth RV value (e.g., 616 in FIG. 6) may be different than each other RV value (e.g., 616 in FIG. 6). In aspects, the DAI (e.g., 618, 619 in FIG. 6) may include a first DAI (e.g., 618, 619 in FIG. 6) indicative of a first count for a first DL grant associated with the first set of bits (e.g., 622 in FIG. 6; 706 in FIG. 7; 806 in FIG. 8) and the first HARQ feedback transmission and a second DAI (e.g., 618, 619 in FIG. 6) indicative of a second count for a second DL grant associated with the second set of bits (e.g., 624, 626 in FIG. 6; 708, 710 in FIG. 7; 808, 810 in FIG. 8) and the second HARQ feedback transmission. The second count may be different than the first count, and the first HARQ feedback transmission may be an initial HARQ feedback transmission, while the second HARQ feedback transmission may be a retransmission Re-Tx of the initial HARQ feedback transmission. The UE 502 may be configured to map (at 508) the first set of bits (e.g., 622 in FIG. 6; 706 in FIG. 7; 806 in FIG. 8) as a first grouping and the second set of bits (e.g., 624, 626 in FIG. 6; 708, 710 in FIG. 7; 808, 810 in FIG. 8) as a second grouping, which is different than the first grouping, to a coding (e.g., 610 in FIG. 6) for an UL channel. For example, the first grouping may be associated with an initial Tx of HARQ feedback bits and the second grouping may be associated with a Re-Tx of HARQ feedback bits for the DL transmission 506 (e.g., 606 in FIG. 6), in some aspects, while in other aspects, the first and second groupings may each be associated with Re-Tx of HARQ feedback bits for the DL transmission 506 (e.g., 606 in FIG. 6). The UE 502 may be configured to map (at 508) the first and second groupings to the coding (e.g., 610 in FIG. 6) for the UL channel in order to improve coding gain and/or to improve decoding. The mapping (at 510) to the UL channel coding (e.g., 610 in FIG. 6) may vary, in aspects, based on the type of coding (e.g., 610 in FIG. 6) utilized. In one example, the coding (e.g., 610 in FIG. 6) is an RM coding (e.g., 704 in FIG. 7), and to transmit/provide the indication 510 of the first set of bits (e.g., 622 in FIG. 6; 706 in FIG. 7; 806 in FIG. 8) and the second set of bits (e.g., 624, 626 in FIG. 6; 708, 710 in FIG. 7; 808, 810 in FIG. 8) in accordance with the first grouping and the second grouping, the UE 502 may be configured to include the first set of bits (e.g., 622 in FIG. 6; 706 in FIG. 7; 806 in FIG. 8) at an initial position in accordance with the coding (e.g., 610 in FIG. 6), and append the second set of bits (e.g., 624, 626 in FIG. 6; 708, 710 in FIG. 7; 808, 810 in FIG. 8) at a subsequent position in accordance with the coding (e.g., 610 in FIG. 6). The initial position may be associated with a higher reliability (e.g., 705 in FIG. 7; 804 in FIG. 8) for the coding (e.g., 610 in FIG. 6) than the subsequent position, in such aspects. In another example, the coding (e.g., 610 in FIG. 6) may be a polar coding (e.g., 802 in FIG. 8), and to transmit/provide the indication 510 of the first set of bits (e.g., 622 in FIG. 6; 706 in FIG. 7; 806 in FIG. 8) and the second set of bits (e.g., 624, 626 in FIG. 6; 708, 710 in FIG. 7; 808, 810 in FIG. 8) in accordance with the first grouping and the second grouping, the UE 502 may be configured to include the second set of bits (e.g., 624, 626 in FIG. 6; 708, 710 in FIG. 7; 808, 810 in FIG. 8) at an initial position in accordance with the coding (e.g., 610 in FIG. 6), and append the first set of bits (e.g., 622 in FIG. 6; 706 in FIG. 7; 806 in FIG. 8) at a subsequent position in accordance with the coding (e.g., 610 in FIG. 6). The initial position may be associated with a lower reliability (e.g., 705 in FIG. 7; 804 in FIG. 8) for the coding than the subsequent position, in such aspects.

At 1004, the network node receives, from the UE and via an UL channel, an indication of a first set of bits associated with a first HARQ feedback transmission for the DL transmission and a second set of bits associated with a second HARQ feedback transmission for the DL transmission, where the first set of bits is in a first grouping and the second set of bits is in a second grouping, and where a mapping to a coding of the UL channel is based on the first grouping of the first set of bits and the second grouping of the second set of bits that is different than the first grouping. For example, the transmission may be performed by one or more of the component 199, the transceiver(s) 1346, and/or the antenna 1380 in FIG. 13. FIG. 5 illustrates, in the context of FIGS. 6, 7, 8, an example of a network node (e.g., the base station 504) receiving such an indication from a UE (e.g., the UE 502).

The UE 502 may be configured to transmit/provide, and the network node (e.g., the base station 504) may be configured to receive, with the coding (e.g., 610 in FIG. 6) via the UL channel, an indication 510 of the first set of bits (e.g., 622 in FIG. 6; 706 in FIG. 7; 806 in FIG. 8) and the second set of bits (e.g., 624, 626 in FIG. 6; 708, 710 in FIG. 7; 808, 810 in FIG. 8) in accordance with the first grouping and the second grouping. Subsequent to receiving the indication 510, the network node (e.g., the base station 504) may be configured to decode (at 512) the first set of bits (e.g., 622 in FIG. 6; 706 in FIG. 7; 806 in FIG. 8) in accordance with a first BLER target and the second set of bits (e.g., 624, 626 in FIG. 6; 708, 710 in FIG. 7; 808, 810 in FIG. 8) in accordance with a second BLER target that is lower than the first BLER target. The first set of bits (e.g., 622 in FIG. 6; 706 in FIG. 7; 806 in FIG. 8) may be associated with a first probability distribution (e.g., 410 in FIG. 4; 705 in FIG. 7; 804 in FIG. 8) and the second set of bits (e.g., 624, 626 in FIG. 6; 708, 710 in FIG. 7; 808, 810 in FIG. 8) may be associated with a second probability distribution (e.g., 412 in FIG. 4; 705 in FIG. 7; 804 in FIG. 8) that is different than the first probability distribution (e.g., 410 in FIG. 4; 705 in FIG. 7; 804 in FIG. 8).

Figure 11:
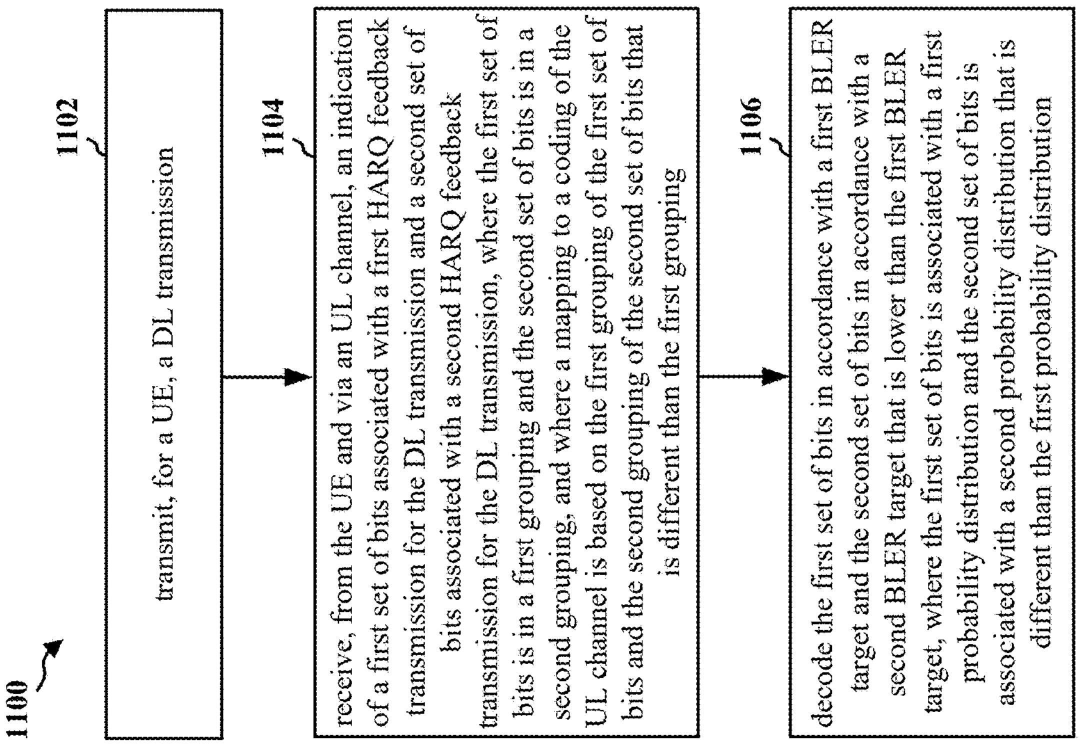
FIG. 11 is a flowchart of a method of wireless communication.

FIG. 11 is a flowchart 1100 of a method of wireless communication. The method may be performed by a network node such as a base station, a gNB, etc. (e.g., the base station 102, 404, 504, 604; the network entity 1202, 1302). In some aspects, the method may include aspects described in connection with the communication flow in FIG. 5, and/or aspects described in FIGS. 4, 6, 7, 8. The method may be for grouping HARQ-ACK bits based on retransmission number. The method may improve coding gains and provide improved knowledge of prior HARQ feedback bits over marginal distributions for decoding by grouping HARQ feedback bits with the same distribution together during channel code mapping.

At 1102, the network node transmits, for a UE, a DL transmission. For example, the transmission may be performed by one or more of the component 199, the transceiver(s) 1346, and/or the antenna 1380 in FIG. 13. FIG. 5 illustrates, in the context of FIGS. 6, 7, 8, an example of a network node (e.g., the base station 504) transmitting such a DL transmission to a UE (e.g., the UE 502).

The UE 502 may be configured to receive, and the base station 504 may be configured to transmit/provide, a DL transmission 506 (e.g., 606 in FIG. 6). The UE 502 may be configured to identify (at 508) at least two sets of bits (e.g., 612 in FIG. 6) associated with HARQ feedback for the DL transmission 506 (e.g., 606 in FIG. 6) from a network node (e.g., the base station 504). A first set of bits (e.g., 622 in FIG. 6; 706 in FIG. 7; 806 in FIG. 8) of the at least two sets of bits (e.g., 612 in FIG. 6) may be associated with a first HARQ feedback transmission and a second set of bits (e.g., 624, 626 in FIG. 6; 708, 710 in FIG. 7; 808, 810 in FIG. 8) of the at least two sets of bits (e.g., 612 in FIG. 6) may be associated with a second HARQ feedback transmission for the DL transmission 506 (e.g., 606 in FIG. 6). The first HARQ feedback transmission may be an initial Tx or a Re-Tx, and the second HARQ feedback transmission may be a Re-Tx. In aspects, the first set of bits (e.g., 622 in FIG. 6; 706 in FIG. 7; 806 in FIG. 8) may be associated with a first probability distribution (e.g., 410 in FIG. 4; 705 in FIG. 7; 804 in FIG. 8) and the second set of bits (e.g., 624, 626 in FIG. 6; 708, 710 in FIG. 7; 808, 810 in FIG. 8) may be associated with a second probability distribution (e.g., 412 in FIG. 4; 705 in FIG. 7; 804 in FIG. 8) that is different than the first probability distribution (e.g., 410 in FIG. 4; 705 in FIG. 7; 804 in FIG. 8). In aspects, the UE 502 may be configured to identify (at 508) the at least two sets of bits (e.g., 612 in FIG. 6) associated with the HARQ feedback based on at least one of a new data indication (NDI) (e.g., 614 in FIG. 6), a redundancy version (RV) value (e.g., 616 in FIG. 6), a DL assignment index (DAI) (e.g., 618, 619 in FIG. 6) (e.g., in a PDSCH), or an index indication (e.g., 620 in FIG. 6) of a retransmission index (e.g., a unique and/or dedicated Re-Tx index field) associated with the at least two sets of bits (e.g., 612 in FIG. 6). In aspects, the NDI (e.g., 614 in FIG. 6) may include a first NDI (e.g., 614 in FIG. 6) indicative of the first set of bits (e.g., 622 in FIG. 6; 706 in FIG. 7; 806 in FIG. 8) associated with the first HARQ feedback transmission being an initial HARQ feedback transmission and a second NDI (e.g., 614 in FIG. 6) indicative of the second set of bits (e.g., 624, 626 in FIG. 6; 708, 710 in FIG. 7; 808, 810 in FIG. 8) associated with the second HARQ feedback transmission being a retransmission of the initial HARQ feedback transmission. In aspects, the RV value (e.g., 616 in FIG. 6) may include a first RV value (e.g., 616 in FIG. 6) indicative of the first set of bits (e.g., 622 in FIG. 6; 706 in FIG. 7; 806 in FIG. 8) associated with the first HARQ feedback transmission being an initial HARQ feedback transmission and a second RV value (e.g., 616 in FIG. 6), from a set of RV values, indicative of the second set of bits (e.g., 624, 626 in FIG. 6; 708, 710 in FIG. 7; 808, 810 in FIG. 8) associated with the second HARQ feedback transmission being a retransmission of the initial HARQ feedback transmission, where the second RV value (e.g., 616 in FIG. 6) is different than the first RV value (e.g., 616 in FIG. 6). In some aspects, the first RV value (e.g., 616 in FIG. 6) may be zero and the set of RV values may include values including at least one of: one (1), two (2), or three (3). The at least two sets of bits (e.g., 612 in FIG. 6) associated with the HARQ feedback for the DL transmission 506 (e.g., 606 in FIG. 6) may include a third set of bits (or a third and a fourth set of bits) associated with a third HARQ feedback transmission (or a third and a fourth HARQ feedback transmission). In such aspects, the RV value (e.g., 616 in FIG. 6) may include a third RV value (e.g., 616 in FIG. 6) (and also a fourth RV value), from the set of RV values, which may be indicative of the third set of bits (and also the fourth set of bits) associated with the third HARQ feedback transmission (and also the fourth HARQ feedback transmission) being an additional retransmission(s) of the initial HARQ feedback transmission. The third RV value (e.g., 616 in FIG. 6) may be different than both the first RV value (e.g., 616 in FIG. 6) and the second RV value (e.g., 616 in FIG. 6); likewise, a fourth RV value (e.g., 616 in FIG. 6) may be different than each other RV value (e.g., 616 in FIG. 6). In aspects, the DAI (e.g., 618, 619 in FIG. 6) may include a first DAI (e.g., 618, 619 in FIG. 6) indicative of a first count for a first DL grant associated with the first set of bits (e.g., 622 in FIG. 6; 706 in FIG. 7; 806 in FIG. 8) and the first HARQ feedback transmission and a second DAI (e.g., 618, 619 in FIG. 6) indicative of a second count for a second DL grant associated with the second set of bits (e.g., 624, 626 in FIG. 6; 708, 710 in FIG. 7; 808, 810 in FIG. 8) and the second HARQ feedback transmission. The second count may be different than the first count, and the first HARQ feedback transmission may be an initial HARQ feedback transmission, while the second HARQ feedback transmission may be a retransmission Re-Tx of the initial HARQ feedback transmission. The UE 502 may be configured to map (at 508) the first set of bits (e.g., 622 in FIG. 6; 706 in FIG. 7; 806 in FIG. 8) as a first grouping and the second set of bits (e.g., 624, 626 in FIG. 6; 708, 710 in FIG. 7; 808, 810 in FIG. 8) as a second grouping, which is different than the first grouping, to a coding (e.g., 610 in FIG. 6) for an UL channel. For example, the first grouping may be associated with an initial Tx of HARQ feedback bits and the second grouping may be associated with a Re-Tx of HARQ feedback bits for the DL transmission 506 (e.g., 606 in FIG. 6), in some aspects, while in other aspects, the first and second groupings may each be associated with Re-Tx of HARQ feedback bits for the DL transmission 506 (e.g., 606 in FIG. 6). The UE 502 may be configured to map (at 508) the first and second groupings to the coding (e.g., 610 in FIG. 6) for the UL channel in order to improve coding gain and/or to improve decoding. The mapping (at 510) to the UL channel coding (e.g., 610 in FIG. 6) may vary, in aspects, based on the type of coding (e.g., 610 in FIG. 6) utilized. In one example, the coding (e.g., 610 in FIG. 6) is an RM coding (e.g., 704 in FIG. 7), and to transmit/provide the indication 510 of the first set of bits (e.g., 622 in FIG. 6; 706 in FIG. 7; 806 in FIG. 8) and the second set of bits (e.g., 624, 626 in FIG. 6; 708, 710 in FIG. 7; 808, 810 in FIG. 8) in accordance with the first grouping and the second grouping, the UE 502 may be configured to include the first set of bits (e.g., 622 in FIG. 6; 706 in FIG. 7; 806 in FIG. 8) at an initial position in accordance with the coding (e.g., 610 in FIG. 6), and append the second set of bits (e.g., 624, 626 in FIG. 6; 708, 710 in FIG. 7; 808, 810 in FIG. 8) at a subsequent position in accordance with the coding (e.g., 610 in FIG. 6). The initial position may be associated with a higher reliability (e.g., 705 in FIG. 7; 804 in FIG. 8) for the coding (e.g., 610 in FIG. 6) than the subsequent position, in such aspects. In another example, the coding (e.g., 610 in FIG. 6) may be a polar coding (e.g., 802 in FIG. 8), and to transmit/provide the indication 510 of the first set of bits (e.g., 622 in FIG. 6; 706 in FIG. 7; 806 in FIG. 8) and the second set of bits (e.g., 624, 626 in FIG. 6; 708, 710 in FIG. 7; 808, 810 in FIG. 8) in accordance with the first grouping and the second grouping, the UE 502 may be configured to include the second set of bits (e.g., 624, 626 in FIG. 6; 708, 710 in FIG. 7; 808, 810 in FIG. 8) at an initial position in accordance with the coding (e.g., 610 in FIG. 6), and append the first set of bits (e.g., 622 in FIG. 6; 706 in FIG. 7; 806 in FIG. 8) at a subsequent position in accordance with the coding (e.g., 610 in FIG. 6). The initial position may be associated with a lower reliability (e.g., 705 in FIG. 7; 804 in FIG. 8) for the coding than the subsequent position, in such aspects.

At 1104, the network node receives, from the UE and via an UL channel, an indication of a first set of bits associated with a first HARQ feedback transmission for the DL transmission and a second set of bits associated with a second HARQ feedback transmission for the DL transmission, where the first set of bits is in a first grouping and the second set of bits is in a second grouping, and where a mapping to a coding of the UL channel is based on the first grouping of the first set of bits and the second grouping of the second set of bits that is different than the first grouping. For example, the transmission may be performed by one or more of the component 199, the transceiver(s) 1346, and/or the antenna 1380 in FIG. 13. FIG. 5 illustrates, in the context of FIGS. 6, 7, 8, an example of a network node (e.g., the base station 504) receiving such an indication from a UE (e.g., the UE 502).

The UE 502 may be configured to transmit/provide, and the network node (e.g., the base station 504) may be configured to receive, with the coding (e.g., 610 in FIG. 6) via the UL channel, an indication 510 of the first set of bits (e.g., 622 in FIG. 6; 706 in FIG. 7; 806 in FIG. 8) and the second set of bits (e.g., 624, 626 in FIG. 6; 708, 710 in FIG. 7; 808, 810 in FIG. 8) in accordance with the first grouping and the second grouping.

At 1106, the network node decodes the first set of bits in accordance with a first block error rate (BLER) target and the second set of bits in accordance with a second BLER target that is lower than the first BLER target, where the first set of bits is associated with a first probability distribution and the second set of bits is associated with a second probability distribution that is different than the first probability distribution. For example, the decoding may be performed by one or more of the component 199, the transceiver(s) 1346, and/or the antenna 1380 in FIG. 13. FIG. 5 illustrates, in the context of FIGS. 6, 7, 8, an example of a network node (e.g., the base station 504) so decoding a first/second set of bits from a UE (e.g., the UE 502).

Subsequent to receiving the indication 510, the network node (e.g., the base station 504) may be configured to decode (at 512) the first set of bits (e.g., 622 in FIG. 6; 706 in FIG. 7; 806 in FIG. 8) in accordance with a first BLER target and the second set of bits (e.g., 624, 626 in FIG. 6; 708, 710 in FIG. 7; 808, 810 in FIG. 8) in accordance with a second BLER target that is lower than the first BLER target. The first set of bits (e.g., 622 in FIG. 6; 706 in FIG. 7; 806 in FIG. 8) may be associated with a first probability distribution (e.g., 410 in FIG. 4; 705 in FIG. 7; 804 in FIG. 8) and the second set of bits (e.g., 624, 626 in FIG. 6; 708, 710 in FIG. 7; 808, 810 in FIG. 8) may be associated with a second probability distribution (e.g., 412 in FIG. 4; 705 in FIG. 7; 804 in FIG. 8) that is different than the first probability distribution (e.g., 410 in FIG. 4; 705 in FIG. 7; 804 in FIG. 8).

Figure 12:
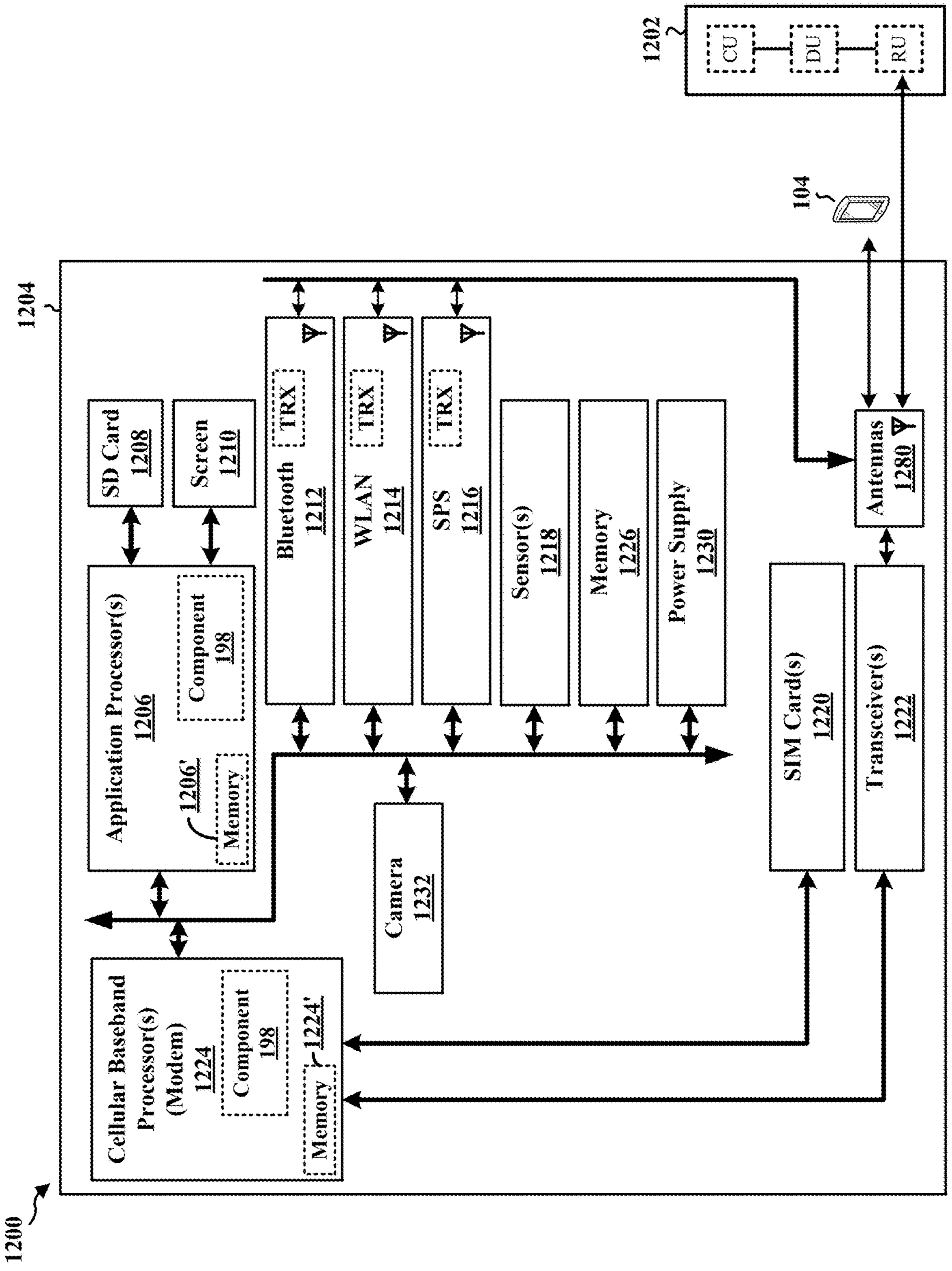
FIG. 12 is a diagram illustrating an example of a hardware implementation for an example apparatus and/or network entity.

FIG. 12 is a diagram 1200 illustrating an example of a hardware implementation for an apparatus 1204. The apparatus 1204 may be a UE, a component of a UE, or may implement UE functionality. In some aspects, the apparatus 1204 may include at least one cellular baseband processor 1224 (also referred to as a modem) coupled to one or more transceivers 1222 (e.g., cellular RF transceiver). The cellular baseband processor(s) 1224 may include at least one on-chip memory 1224'. In some aspects, the apparatus 1204 may further include one or more subscriber identity modules (SIM) cards 1220 and at least one application processor 1206 coupled to a secure digital (SD) card 1208 and a screen 1210. The application processor(s) 1206 may include on-chip memory 1206'. In some aspects, the apparatus 1204 may further include a Bluetooth module 1212, a WLAN module 1214, an SPS module 1216 (e.g., GNSS module), one or more sensor modules 1218 (e.g., barometric pressure sensor/altimeter; motion sensor such as inertial measurement unit (IMU), gyroscope, and/or accelerometer(s); light detection and ranging (LIDAR), radio assisted detection and ranging (RADAR), sound navigation and ranging (SONAR), magnetometer, audio and/or other technologies used for positioning), additional memory modules 1226, a power supply 1230, and/or a camera 1232. The Bluetooth module 1212, the WLAN module 1214, and the SPS module 1216 may include an on-chip transceiver (TRX) (or in some cases, just a receiver (RX)). The Bluetooth module 1212, the WLAN module 1214, and the SPS module 1216 may include their own dedicated antennas and/or utilize the antennas 1280 for communication. The cellular baseband processor(s) 1224 communicates through the transceiver(s) 1222 via one or more antennas 1280 with the UE 104 and/or with an RU associated with a network entity 1202. The cellular baseband processor(s) 1224 and the application processor(s) 1206 may each include a computer-readable medium/memory 1224', 1206', respectively. The additional memory modules 1226 may also be considered a computer-readable medium/memory. Each computer-readable medium/memory 1224', 1206', 1226 may be non-transitory. The cellular baseband processor(s) 1224 and the application processor(s) 1206 are each responsible for general processing, including the execution of software stored on the computer-readable medium/memory. The software, when executed by the cellular baseband processor(s) 1224/application processor(s) 1206, causes the cellular baseband processor(s) 1224/application processor(s) 1206 to perform the various functions described supra. The cellular baseband processor(s) 1224 and the application processor(s) 1206 are configured to perform the various functions described supra based at least in part of the information stored in the memory. That is, the cellular baseband processor(s) 1224 and the application processor(s) 1206 may be configured to perform a first subset of the various functions described supra without information stored in the memory and may be configured to perform a second subset of the various functions described supra based on the information stored in the memory. The computer-readable medium/memory may also be used for storing data that is manipulated by the cellular baseband processor(s) 1224/application processor(s) 1206 when executing software. The cellular baseband processor(s) 1224/application processor(s) 1206 may be a component of the UE 350 and may include the at least one memory 360 and/or at least one of the TX processor 368, the RX processor 356, and the controller/processor 359. In one configuration, the apparatus 1204 may be at least one processor chip (modem and/or application) and include just the cellular baseband processor(s) 1224 and/or the application processor(s) 1206, and in another configuration, the apparatus 1204 may be the entire UE (e.g., see UE 350 of FIG. 3) and include the additional modules of the apparatus 1204.

As discussed supra, the component 198 may be configured to identify at least two sets of bits associated with HARQ feedback for a DL transmission from a network node, where a first set of bits of the at least two sets of bits is associated with a first HARQ feedback transmission and a second set of bits of the at least two sets of bits is associated with a second HARQ feedback transmission for the DL transmission. The component 198 may be configured to map the first set of bits as a first grouping and the second set of bits as a second grouping, which is different than the first grouping, to a coding for an UL channel. The component 198 may be configured to transmit, to the network node and with the coding via the UL channel, an indication of the first set of bits and the second set of bits in accordance with the first grouping and the second grouping. The component 198 may be further configured to perform any of the aspects described in connection with the flowcharts in any of FIGS. 9, 10, 11, and/or any of the aspects performed by a UE for any of FIGS. 4-8. The component 198 may be within the cellular baseband processor(s) 1224, the application processor(s) 1206, or both the cellular baseband processor(s) 1224 and the application processor(s) 1206. The component 198 may be one or more hardware components specifically configured to carry out the stated processes/algorithm, implemented by one or more processors configured to perform the stated processes/algorithm, stored within a computer-readable medium for implementation by one or more processors, or some combination thereof. When multiple processors are implemented, the multiple processors may perform the stated processes/algorithm individually or in combination. As shown, the apparatus 1204 may include a variety of components configured for various functions. In one configuration, the apparatus 1204, and in particular the cellular baseband processor(s) 1224 and/or the application processor(s) 1206, may include means for identifying at least two sets of bits associated with HARQ feedback for a DL transmission from a network node, where a first set of bits of the at least two sets of bits is associated with a first HARQ feedback transmission and a second set of bits of the at least two sets of bits is associated with a second HARQ feedback transmission for the DL transmission. In the configuration, the apparatus 1204, and in particular the cellular baseband processor(s) 1224 and/or the application processor(s) 1206, may include means for mapping the first set of bits as a first grouping and the second set of bits as a second grouping, which is different than the first grouping, to a coding for an UL channel. In the configuration, the apparatus 1204, and in particular the cellular baseband processor(s) 1224 and/or the application processor(s) 1206, may include means for transmitting, to the network node and with the coding via the UL channel, an indication of the first set of bits and the second set of bits in accordance with the first grouping and the second grouping. The means may be the component 198 of the apparatus 1204 configured to perform the functions recited by the means. As described supra, the apparatus 1204 may include the TX processor 368, the RX processor 356, and the controller/processor 359. As such, in one configuration, the means may be the TX processor 368, the RX processor 356, and/or the controller/processor 359 configured to perform the functions recited by the means.

Figure 13:
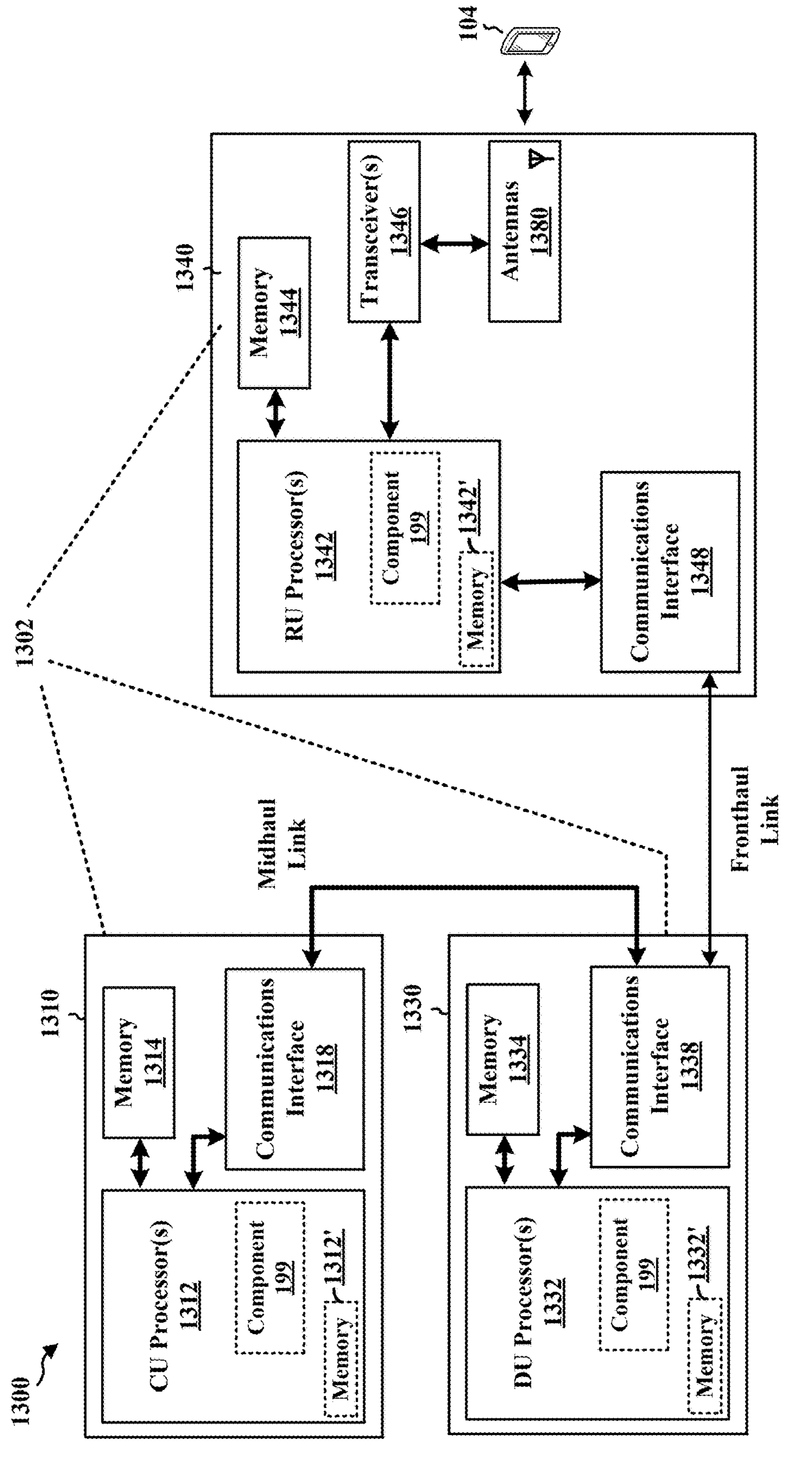
FIG. 13 is a diagram illustrating an example of a hardware implementation for an example network entity.

FIG. 13 is a diagram 1300 illustrating an example of a hardware implementation for a network entity 1302. The network entity 1302 may be a BS, a component of a BS, or may implement BS functionality. The network entity 1302 may include at least one of a CU 1310, a DU 1330, or an RU 1340. For example, depending on the layer functionality handled by the component 199, the network entity 1302 may include the CU 1310; both the CU 1310 and the DU 1330; each of the CU 1310, the DU 1330, and the RU 1340; the DU 1330; both the DU 1330 and the RU 1340; or the RU 1340. The CU 1310 may include at least one CU processor 1312. The CU processor(s) 1312 may include on-chip memory 1312'. In some aspects, the CU 1310 may further include additional memory modules 1314 and a communications interface 1318. The CU 1310 communicates with the DU 1330 through a midhaul link, such as an F1 interface. The DU 1330 may include at least one DU processor 1332. The DU processor(s) 1332 may include on-chip memory 1332'. In some aspects, the DU 1330 may further include additional memory modules 1334 and a communications interface 1338. The DU 1330 communicates with the RU 1340 through a fronthaul link. The RU 1340 may include at least one RU processor 1342. The RU processor(s) 1342 may include on-chip memory 1342'. In some aspects, the RU 1340 may further include additional memory modules 1344, one or more transceivers 1346, antennas 1380, and a communications interface 1348. The RU 1340 communicates with the UE 104. The on-chip memory 1312', 1332', 1342' and the additional memory modules 1314, 1334, 1344 may each be considered a computer-readable medium/memory. Each computer-readable medium/memory may be non-transitory. Each of the processors 1312, 1332, 1342 is responsible for general processing, including the execution of software stored on the computer-readable medium/memory. The software, when executed by the corresponding processor(s) causes the processor(s) to perform the various functions described supra. The computer-readable medium/memory may also be used for storing data that is manipulated by the processor(s) when executing software.

As discussed supra, the component 199 may be configured to transmit, for a UE, a DL transmission. The component 199 may be configured to receive, from the UE and via an UL channel, an indication of a first set of bits associated with a HARQ feedback transmission for the DL transmission and a second set of bits associated with a second HARQ feedback transmission for the DL transmission, where the first set of bits is in a first grouping and the second set of bits is in a second grouping, and where a mapping to a coding of the UL channel is based on the first grouping of the first set of bits and the second grouping of the second set of bits that is different than the first grouping. The component 199 may be configured to decode the first set of bits in accordance with a first BLER target and the second set of bits in accordance with a second BLER target that is lower than the first BLER target, where the first set of bits is associated with a first probability distribution and the second set of bits is associated with a second probability distribution that is different than the first probability distribution. The component 199 may be further configured to perform any of the aspects described in connection with the flowcharts in any of FIGS. 9, 10, 11, and/or any of the aspects performed by a network node (e.g., a base station, a gNB, a network entity, etc.) for any of FIGS. 4-8. The component 199 may be within one or more processors of one or more of the CU 1310, DU 1330, and the RU 1340. The component 199 may be one or more hardware components specifically configured to carry out the stated processes/algorithm, implemented by one or more processors configured to perform the stated processes/algorithm, stored within a computer-readable medium for implementation by one or more processors, or some combination thereof. When multiple processors are implemented, the multiple processors may perform the stated processes/algorithm individually or in combination. The network entity 1302 may include a variety of components configured for various functions. In one configuration, the network entity 1302 may include means for transmitting, for a UE, a DL transmission. In the configuration, the network entity 1302 may include means for receiving, from the UE and via an UL channel, an indication of a first set of bits associated with a HARQ feedback transmission for the DL transmission and a second set of bits associated with a second HARQ feedback transmission for the DL transmission, where the first set of bits is in a first grouping and the second set of bits is in a second grouping, and where a mapping to a coding of the UL channel is based on the first grouping of the first set of bits and the second grouping of the second set of bits that is different than the first grouping. In the configuration, the network entity 1302 may include means for decoding the first set of bits in accordance with a first BLER target and the second set of bits in accordance with a second BLER target that is lower than the first BLER target, where the first set of bits is associated with a first probability distribution and the second set of bits is associated with a second probability distribution that is different than the first probability distribution. The means may be the component 199 of the network entity 1302 configured to perform the functions recited by the means. As described supra, the network entity 1302 may include the TX processor 316, the RX processor 370, and the controller/processor 375. As such, in one configuration, the means may be the TX processor 316, the RX processor 370, and/or the controller/processor 375 configured to perform the functions recited by the means.

A UE may provide HARQ feedback for DL transmissions received from a network node to indicate an acknowledgement or a negative acknowledgement of the DL transmissions for the network node. In some cases, the UE may provide an initial transmission of HARQ feedback and one or more retransmissions of the HARQ feedback. However, the BLER target for an initial transmission and a given retransmission may be very different and may correspond to different probability distributions for the respective HARQ-ACK bits. For example, the initial transmission may have a first BLER target and a corresponding probability distribution of HARQ bits, while a retransmission may have a lower BLER target and a corresponding probability distribution of HARQ bits that is more biased towards an ACK bit than the initial transmission (e.g., a higher probability than the initial transmission). Current HARQ feedback solutions lack mechanisms that utilize grouping to (i) take advantage of channel coding gains, and (ii) achieve decoding improvements as current solutions for decoders are limited to marginal distributions of HARQ feedback bits that suffer from performance loss.

Aspects herein for grouping HARQ-ACK bits based on retransmission number provide improvements to the issues noted above. Aspects improve coding gains by grouping HARQ feedback bits with the same distribution together during channel code mapping. Aspects also provide improved knowledge of prior HARQ feedback bits over marginal distributions for decoding by grouping HARQ feedback bits with the same distribution together during channel code mapping.

It is understood that the specific order or hierarchy of blocks in the processes/flowcharts disclosed is an illustration of example approaches. Based upon design preferences, it is understood that the specific order or hierarchy of blocks in the processes/flowcharts may be rearranged. Further, some blocks may be combined or omitted. The accompanying method claims present elements of the various blocks in a sample order, and are not limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not limited to the aspects described herein, but are to be accorded the full scope consistent with the language claims. Reference to an element in the singular does not mean "one and only one" unless specifically so stated, but rather "one or more." Terms such as "if," "when," and "while" do not imply an immediate temporal relationship or reaction. That is, these phrases, e.g., "when," do not imply an immediate action in response to or during the occurrence of an action, but simply imply that if a condition is met then an action will occur, but without requiring a specific or immediate time constraint for the action to occur. The word "exemplary" is used herein to mean "serving as an example, instance, or illustration." Any aspect described herein as "exemplary" is not necessarily to be construed as preferred or advantageous over other aspects. Unless specifically stated otherwise, the term "some" refers to one or more. Combinations such as "at least one of A, B, or C," "one or more of A, B, or C," "at least one of A, B, and C," "one or more of A, B, and C," and "A, B, C, or any combination thereof" include any combination of A, B, and/or C, and may include multiples of A, multiples of B, or multiples of C. Specifically, combinations such as "at least one of A, B, or C," "one or more of A, B, or C," "at least one of A, B, and C," "one or more of A, B, and C," and "A, B, C, or any combination thereof" may be A only, B only, C only, A and B, A and C, B and C, or A and B and C, where any such combinations may contain one or more member or members of A, B, or C. Sets should be interpreted as a set of elements where the elements number one or more. Accordingly, for a set of X, X would include one or more elements. When at least one processor is configured to perform a set of functions, the at least one processor, individually or in any combination, is configured to perform the set of functions. Accordingly, each processor of the at least one processor may be configured to perform a particular subset of the set of functions, where the subset is the full set, a proper subset of the set, or an empty subset of the set. A processor may be referred to as processor circuitry. A memory/memory module may be referred to as memory circuitry. If a first apparatus receives data from or transmits data to a second apparatus, the data may be received/transmitted directly between the first and second apparatuses, or indirectly between the first and second apparatuses through a set of apparatuses. A device configured to "output" data or "provide" data, such as a transmission, signal, or message, may transmit the data, for example with a transceiver, or may send the data to a device that transmits the data. A device configured to "obtain" data, such as a transmission, signal, or message, may receive, for example with a transceiver, or may obtain the data from a device that receives the data. Information stored in a memory includes instructions and/or data. All structural and functional equivalents to the elements of the various aspects described throughout this disclosure that are known or later come to be known to those of ordinary skill in the art are expressly incorporated herein by reference and are encompassed by the claims. Moreover, nothing disclosed herein is dedicated to the public regardless of whether such disclosure is explicitly recited in the claims. The words "module," "mechanism," "element," "device," and the like may not be a substitute for the word "means." As such, no claim element is to be construed as a means plus function unless the element is expressly recited using the phrase "means for."

As used herein, the phrase "based on" shall not be construed as a reference to a closed set of information, one or more conditions, one or more factors, or the like. In other words, the phrase "based on A" (where "A" may be information, a condition, a factor, or the like) shall be construed as "based at least on A" unless specifically recited differently.

The following aspects are illustrative only and may be combined with other aspects or teachings described herein, without limitation.

Aspect 1 is a method of wireless communication at a user equipment (UE), comprising: identifying at least two sets of bits associated with hybrid automatic repeat request (HARQ) feedback for a downlink (DL) transmission from a network node, wherein a first set of bits of the at least two sets of bits is associated with a first HARQ feedback transmission and a second set of bits of the at least two sets of bits is associated with a second HARQ feedback transmission for the DL transmission; mapping the first set of bits as a first grouping and the second set of bits as a second grouping, which is different than the first grouping, to a coding for an uplink (UL) channel; and transmitting, to the network node and with the coding via the UL channel, an indication of the first set of bits and the second set of bits in accordance with the first grouping and the second grouping.

Aspect 2 is the method of aspect 1, wherein identifying the at least two sets of bits associated with the HARQ feedback is based on at least one of a new data indication (NDI), a redundancy version (RV) value, a DL assignment index (DAI), or an index indication of a retransmission index associated with the at least two sets of bits.

Aspect 3 is the method of aspect 2, wherein the NDI includes a first NDI indicative of the first set of bits associated with the first HARQ feedback transmission being an initial HARQ feedback transmission and a second NDI indicative of the second set of bits associated with the second HARQ feedback transmission being a retransmission of the initial HARQ feedback transmission.

Aspect 4 is the method of aspect 2, wherein the RV value includes a first RV value indicative of the first set of bits associated with the first HARQ feedback transmission being an initial HARQ feedback transmission and a second RV value, from a set of RV values, indicative of the second set of bits associated with the second HARQ feedback transmission being a retransmission of the initial HARQ feedback transmission, wherein the second RV value is different than the first RV value.

Aspect 5 is the method of aspect 4, wherein the first RV value is zero and the set of RV values includes values including at least one of: one, two, or three.

Aspect 6 is the method of aspect 4, wherein the at least two sets of bits associated with the HARQ feedback for the DL transmission includes a third set of bits associated with a third HARQ feedback transmission; wherein the RV value includes a third RV value, from the set of RV values, indicative of the third set of bits associated with the third HARQ feedback transmission being an additional retransmission of the initial HARQ feedback transmission, wherein the third RV value is different than the first RV value and the second RV value.

Aspect 7 is the method of aspect 2, wherein the DAI includes a first DAI indicative of a first count for a first DL grant associated with the first set of bits and the first HARQ feedback transmission and a second DAI indicative of a second count for a second DL grant associated with the second set of bits and the second HARQ feedback transmission, wherein the second count is different than the first count; wherein the first HARQ feedback transmission is an initial HARQ feedback transmission and the second HARQ feedback transmission is a retransmission of the initial HARQ feedback transmission.

Aspect 8 is the method of any of aspects 1 to 7, wherein the first HARQ feedback transmission is an initial HARQ feedback transmission and the second HARQ feedback transmission is a retransmission of the initial HARQ feedback transmission; or wherein the first HARQ feedback transmission is the retransmission of the initial HARQ feedback transmission and the second HARQ feedback transmission is a subsequent retransmission of the initial HARQ feedback transmission.

Aspect 9 is the method of aspect 8, wherein the coding is a Reed-Muller coding, and wherein transmitting, to the network node and with the coding via the UL channel, the indication of the first set of bits and the second set of bits in accordance with the first grouping and the second grouping comprises: including the first set of bits at an initial position in accordance with the coding, and appending the second set of bits at a subsequent position in accordance with the coding.

Aspect 10 is the method of aspect 9, wherein the initial position is associated with a higher reliability for the coding than the subsequent position.

Aspect 11 is the method of aspect 8, wherein the coding is a polar coding, and wherein transmitting, to the network node and with the coding via the UL channel, the indication of the first set of bits and the second set of bits in accordance with the first grouping and the second grouping comprises: including the second set of bits at an initial position in accordance with the coding, and appending the first set of bits at a subsequent position in accordance with the coding.

Aspect 12 is the method of aspect 11, wherein the initial position is associated with a lower reliability for the coding than the subsequent position.

Aspect 13 is the method of any of aspects 1 to 12, wherein the first set of bits is associated with a first probability distribution and the second set of bits is associated with a second probability distribution that is different than the first probability distribution.

Aspect 14 is a method of wireless communication at a network node, comprising: transmitting, for a user equipment (UE), a downlink (DL) transmission; and receiving, from the UE and via an uplink (UL) channel, an indication of a first set of bits associated with a first hybrid automatic repeat request (HARQ) feedback transmission for the DL transmission and a second set of bits associated with a second HARQ feedback transmission for the DL transmission, wherein the first set of bits is in a first grouping and the second set of bits is in a second grouping, and wherein a mapping to a coding of the UL channel is based on the first grouping of the first set of bits and the second grouping of the second set of bits that is different than the first grouping.

Aspect 15 is the method of aspect 14, further comprising: decoding the first set of bits in accordance with a first block error rate (BLER) target and the second set of bits in accordance with a second BLER target that is lower than the first BLER target, wherein the first set of bits is associated with a first probability distribution and the second set of bits is associated with a second probability distribution that is different than the first probability distribution.

Aspect 16 is the method of any of aspects 14 and 15, wherein the first set of bits being in the first grouping and the second set of bits being in the second grouping is based on at least one of a new data indication (NDI), a redundancy version (RV) value, a DL assignment index (DAI), or an index indication of a retransmission index associated with the first set of bits and the second set of bits.

Aspect 17 is the method of aspect 16, wherein the NDI includes a first NDI indicative of the first set of bits associated with the first HARQ feedback transmission being an initial HARQ feedback transmission and a second NDI indicative of the second set of bits associated with the second HARQ feedback transmission being a retransmission of the initial HARQ feedback transmission.

Aspect 18 is the method of aspect 16, wherein the RV value includes a first RV value indicative of the first set of bits associated with the first HARQ feedback transmission being an initial HARQ feedback transmission and a second RV value, from a set of RV values, indicative of the second set of bits associated with the second HARQ feedback transmission being a retransmission of the initial HARQ feedback transmission, wherein the second RV value is different than the first RV value.

Aspect 19 is the method of aspect 18, wherein the first RV value is zero and the set of RV values includes values including at least one of: one, two, or three.

Aspect 20 is the method of aspect 18, wherein receiving the first set of bits and the second set of bits includes receiving a third set of bits associated with a third HARQ feedback transmission for the DL transmission; wherein the RV value includes a third RV value, from the set of RV values, indicative of the third set of bits associated with the third HARQ feedback transmission being an additional retransmission of the initial HARQ feedback transmission, wherein the third RV value is different than the first RV value and the second RV value.

Aspect 21 is the method of aspect 16, wherein the DAI includes a first DAI indicative of a first count for a first DL grant associated with the first set of bits and the first HARQ feedback transmission and a second DAI indicative of a second count for a second DL grant associated with the second set of bits and the second HARQ feedback transmission, wherein the second count is different than the first count; wherein the first HARQ feedback transmission is an initial HARQ feedback transmission and the second HARQ feedback transmission is a retransmission of the initial HARQ feedback transmission.

Aspect 22 is the method of any of aspects 14 to 21, wherein the first HARQ feedback transmission is an initial HARQ feedback transmission and the second HARQ feedback transmission is a retransmission of the initial HARQ feedback transmission; or wherein the first HARQ feedback transmission is the retransmission of the initial HARQ feedback transmission and the second HARQ feedback transmission is a subsequent retransmission of the initial HARQ feedback transmission.

Aspect 23 is the method of aspect 22, wherein the coding is a Reed-Muller coding, and wherein receiving, from the UE and via the UL channel, the indication of the first set of bits and the second set of bits in accordance with the first grouping and the second grouping comprises: receiving the first set of bits at an initial position in accordance with the coding and the second set of bits at a subsequent position in accordance with the coding.

Aspect 24 is the method of aspect 23, wherein the initial position is associated with a higher reliability for the coding than the subsequent position.

Aspect 25 is the method of aspect 22, wherein the coding is a polar coding, and wherein receiving, from the UE and via the UL channel, the indication of the first set of bits and the second set of bits in accordance with the first grouping and the second grouping comprises: receiving the second set of bits at an initial position in accordance with the coding and the first set of bits at a subsequent position in accordance with the coding.

Aspect 26 is the method of aspect 25, wherein the initial position is associated with a lower reliability for the coding than the subsequent position.

Aspect 27 is an apparatus for wireless communication at a user equipment (UE), comprising: at least one memory; and at least one processor coupled to the at least one memory and, based at least in part on information stored in the at least one memory, the at least one processor, individually or in any combination, is configured to perform the method of any of aspects 1 to 13.

Aspect 28 is an apparatus for wireless communication at a user equipment (UE), comprising means for performing each step in the method of any of aspects 1 to 13.

Aspect 29 is the apparatus of any of aspects 27 and 28, further comprising a transceiver configured to receive or to transmit in association with the method of any of aspects 1 to 13.

Aspect 30 is a computer-readable medium (e.g., a non-transitory computer-readable medium) storing computer executable code at a user equipment (UE), the code when executed by at least one processor causes the at least one processor to perform the method of any of aspects 1 to 13.

Aspect 31 is an apparatus for wireless communication at a network node, comprising: at least one memory; and at least one processor coupled to the at least one memory and, based at least in part on information stored in the at least one memory, the at least one processor, individually or in any combination, is configured to perform the method of any of aspects 14 to 26.

Aspect 32 is an apparatus for wireless communication at a network node, comprising means for performing each step in the method of any of aspects 14 to 26.

Aspect 33 is the apparatus of any of aspects 27 and 28, further comprising a transceiver configured to receive or to transmit in association with the method of any of aspects 14 to 26.

Aspect 34 is a computer-readable medium (e.g., a non-transitory computer-readable medium) storing computer executable code at a network node, the code when executed by at least one processor causes the at least one processor to perform the method of any of aspects 14 to 26.

What is claimed is:

1. An apparatus for wireless communication at a user equipment (UE), comprising:

at least one memory; and at least one processor coupled to the at least one memory and, based at least in part on information stored in the at least one memory, the at least one processor, individually or in any combination, is configured to:

identify at least two sets of bits associated with hybrid automatic repeat request (HARQ) feedback for a downlink (DL) transmission from a network node, wherein a first set of bits of the at least two sets of bits is associated with a first HARQ feedback transmission and a second set of bits of the at least two sets of bits is associated with a second HARQ feedback transmission for the DL transmission;

map the first set of bits as a first grouping and the second set of bits as a second grouping, which is different than the first grouping, to a coding for an uplink (UL) channel; and transmit, to the network node and with the coding via the UL channel, an indication of the first set of bits and the second set of bits in accordance with the first grouping and the second grouping.

2. The apparatus of claim 1, wherein to identify the at least two sets of bits associated with the HARQ feedback, the at least one processor, individually or in any combination, is configured to identify the at least two sets of bits associated with the HARQ feedback based on at least one of a new data indication (NDI), a redundancy version (RV) value, a DL assignment index (DAI), or an index indication of a retransmission index associated with the at least two sets of bits.

3. The apparatus of claim 2, wherein the NDI includes a first NDI indicative of the first set of bits associated with the first HARQ feedback transmission being an initial HARQ feedback transmission and a second NDI indicative of the second set of bits associated with the second HARQ feedback transmission being a retransmission of the initial HARQ feedback transmission.

4. The apparatus of claim 2, wherein the RV value includes a first RV value indicative of the first set of bits associated with the first HARQ feedback transmission being an initial HARQ feedback transmission and a second RV value, from a set of RV values, indicative of the second set of bits associated with the second HARQ feedback transmission being a retransmission of the initial HARQ feedback transmission, wherein the second RV value is different than the first RV value.

5. The apparatus of claim 4, wherein the first RV value is zero and the set of RV values includes values including at least one of: one, two, or three.

6. The apparatus of claim 4, wherein the at least two sets of bits associated with the HARQ feedback for the DL transmission includes a third set of bits associated with a third HARQ feedback transmission;

wherein the RV value includes a third RV value, from the set of RV values, indicative of the third set of bits associated with the third HARQ feedback transmission being an additional retransmission of the initial HARQ feedback transmission, wherein the third RV value is different than the first RV value and the second RV value.

7. The apparatus of claim 2, wherein the DAI includes a first DAI indicative of a first count for a first DL grant associated with the first set of bits and the first HARQ feedback transmission and a second DAI indicative of a second count for a second DL grant associated with the second set of bits and the second HARQ feedback transmission, wherein the second count is different than the first count;

wherein the first HARQ feedback transmission is an initial HARQ feedback transmission and the second HARQ feedback transmission is a retransmission of the initial HARQ feedback transmission.

8. The apparatus of claim 1, wherein the first HARQ feedback transmission is an initial HARQ feedback transmission and the second HARQ feedback transmission is a retransmission of the initial HARQ feedback transmission; or wherein the first HARQ feedback transmission is the retransmission of the initial HARQ feedback transmission and the second HARQ feedback transmission is a subsequent retransmission of the initial HARQ feedback transmission.

9. The apparatus of claim 8, wherein the coding is a Reed-Muller coding, and wherein to transmit, to the network node and with the coding via the UL channel, the indication of the first set of bits and the second set of bits in accordance with the first grouping and the second grouping, the at least one processor, individually or in any combination, is configured to:

include the first set of bits at an initial position in accordance with the Reed-Muller coding, and append the second set of bits at a subsequent position in accordance with the Reed-Muller coding.

10. The apparatus of claim 9, wherein the initial position of the first set of bits is associated with a higher reliability based on a first subcode encoding having a larger minimum distance for the Reed-Muller coding than a second subcode encoding of the subsequent position of the second set of bits.

11. The apparatus of claim 8, wherein the coding is a polar coding, and wherein to transmit, to the network node and with the coding via the UL channel, the indication of the first set of bits and the second set of bits in accordance with the first grouping and the second grouping, the at least one processor, individually or in any combination, is configured to:

include the second set of bits at an initial position in accordance with the polar coding, and append the first set of bits at a subsequent position in accordance with the polar coding.

12. The apparatus of claim 11, wherein the subsequent position of the first set of bits is associated with a higher reliability for the polar coding than the initial position of the second set of bits.

13. The apparatus of claim 1, wherein the first set of bits is associated with a first probability distribution and the second set of bits is associated with a second probability distribution that is different than the first probability distribution.

14. The apparatus of claim 1, further comprising at least one transceiver coupled to the at least one processor, wherein to transmit, to the network node and with the coding via the UL channel, the indication of the first set of bits and the second set of bits in accordance with the first grouping and the second grouping, the at least one processor, individually or in any combination, is configured to transmit the indication via the at least one transceiver.

15. An apparatus for wireless communication at a network node, comprising:

at least one memory; and at least one processor coupled to the at least one memory and, based at least in part on information stored in the at least one memory, the at least one processor, individually or in any combination, is configured to:

transmit, for a user equipment (UE), a downlink (DL) transmission; and receive, from the UE and via an uplink (UL) channel, an indication of a first set of bits associated with a first hybrid automatic repeat request (HARQ) feedback transmission for the DL transmission and a second set of bits associated with a second HARQ feedback transmission for the DL transmission, wherein the first set of bits is in a first grouping and the second set of bits is in a second grouping, and wherein a mapping to a coding of the UL channel is based on the first grouping of the first set of bits and the second grouping of the second set of bits that is different than the first grouping.

16. The apparatus of claim 15, wherein the at least one processor, individually or in any combination, is further configured to:

decode the first set of bits in accordance with a first block error rate (BLER) target and the second set of bits in accordance with a second BLER target that is lower than the first BLER target, wherein the first set of bits is associated with a first probability distribution and the second set of bits is associated with a second probability distribution that is different than the first probability distribution.

17. The apparatus of claim 15, wherein the first set of bits being in the first grouping and the second set of bits being in the second grouping is based on at least one of a new data indication (NDI), a redundancy version (RV) value, a DL assignment index (DAI), or an index indication of a retransmission index associated with the first set of bits and the second set of bits.

18. The apparatus of claim 17, wherein the NDI includes a first NDI indicative of the first set of bits associated with the first HARQ feedback transmission being an initial HARQ feedback transmission and a second NDI indicative of the second set of bits associated with the second HARQ feedback transmission being a retransmission of the initial HARQ feedback transmission.

19. The apparatus of claim 17, wherein the RV value includes a first RV value indicative of the first set of bits associated with the first HARQ feedback transmission being an initial HARQ feedback transmission and a second RV value, from a set of RV values, indicative of the second set of bits associated with the second HARQ feedback transmission being a retransmission of the initial HARQ feedback transmission, wherein the second RV value is different than the first RV value.

20. The apparatus of claim 19, wherein the first RV value is zero and the set of RV values includes values including at least one of: one, two, or three.

21. The apparatus of claim 19, wherein to receive the first set of bits and the second set of bits, the at least one processor, individually or in any combination, is configured to receive a third set of bits associated with a third HARQ feedback transmission for the DL transmission;

wherein the RV value includes a third RV value, from the set of RV values, indicative of the third set of bits associated with the third HARQ feedback transmission being an additional retransmission of the initial HARQ feedback transmission, wherein the third RV value is different than the first RV value and the second RV value.

22. The apparatus of claim 17, wherein the DAI includes a first DAI indicative of a first count for a first DL grant associated with the first set of bits and the first HARQ feedback transmission and a second DAI indicative of a second count for a second DL grant associated with the second set of bits and the second HARQ feedback transmission, wherein the second count is different than the first count;

wherein the first HARQ feedback transmission is an initial HARQ feedback transmission and the second HARQ feedback transmission is a retransmission of the initial HARQ feedback transmission.

23. The apparatus of claim 15, wherein the first HARQ feedback transmission is an initial HARQ feedback transmission and the second HARQ feedback transmission is a retransmission of the initial HARQ feedback transmission; or wherein the first HARQ feedback transmission is the retransmission of the initial HARQ feedback transmission and the second HARQ feedback transmission is a subsequent retransmission of the initial HARQ feedback transmission.

24. The apparatus of claim 23, wherein the coding is a Reed-Muller coding, and wherein to receive, from the UE and via the UL channel, the indication of the first set of bits and the second set of bits in accordance with the first grouping and the second grouping, the at least one processor, individually or in any combination, is configured to:

receive the first set of bits at an initial position in accordance with the Reed-Muller coding and the second set of bits at a subsequent position in accordance with the Reed-Muller coding.

25. The apparatus of claim 24, wherein the initial position of the first set of bits is associated with a higher reliability based on a first subcode encoding having a larger minimum distance for the Reed-Muller coding than a second subcode encoding of the subsequent position of the second set of bits.

26. The apparatus of claim 23, wherein the coding is a polar coding, and wherein to receive, from the UE and via the UL channel, the indication of the first set of bits and the second set of bits in accordance with the first grouping and the second grouping, the at least one processor, individually or in any combination, is configured to:

receive the second set of bits at an initial position in accordance with the polar coding and the first set of bits at a subsequent position in accordance with the polar coding.

27. The apparatus of claim 26, wherein the subsequent position of the first set of bits is associated with a higher reliability for the polar coding than the initial position of the second set of bits.

28. The apparatus of claim 15, further comprising at least one transceiver coupled to the at least one processor, wherein to transmit the DL transmission, the at least one processor, individually or in any combination, is configured to transmit the DL transmission via the at least one transceiver.

29. A method of wireless communication at a user equipment (UE), comprising:

identifying at least two sets of bits associated with hybrid automatic repeat request (HARQ) feedback for a downlink (DL) transmission from a network node, wherein a first set of bits of the at least two sets of bits is associated with a first HARQ feedback transmission and a second set of bits of the at least two sets of bits is associated with a second HARQ feedback transmission for the DL transmission;

mapping the first set of bits as a first grouping and the second set of bits as a second grouping, which is different than the first grouping, to a coding for an uplink (UL) channel; and transmitting, to the network node and with the coding via the UL channel, an indication of the first set of bits and the second set of bits in accordance with the first grouping and the second grouping.

30. A method of wireless communication at a network node, comprising:

transmitting, for a user equipment (UE), a downlink (DL) transmission; and receiving, from the UE and via an uplink (UL) channel, an indication of a first set of bits associated with a first hybrid automatic repeat request (HARQ) feedback transmission for the DL transmission and a second set of bits associated with a second HARQ feedback transmission for the DL transmission, wherein the first set of bits is in a first grouping and the second set of bits is in a second grouping, and wherein a mapping to a coding of the UL channel is based on the first grouping of the first set of bits and the second grouping of the second set of bits that is different than the first grouping.

* * * * *